United States Patent [19]

Kubota

[11] Patent Number: 4,970,417
[45] Date of Patent: Nov. 13, 1990

[54] EMITTER COUPLED LOGIC LATCH CIRCUIT

[75] Inventor: Katsuhisa Kubota, Kawasaki, Japan

[73] Assignee: Fujitsu Limited, Kawasaki, Japan

[21] Appl. No.: 374,294

[22] Filed: Jun. 30, 1989

[30] Foreign Application Priority Data

Jul. 7, 1988 [JP] Japan .................................. 63-169543
Jul. 7, 1988 [JP] Japan .................................. 63-169544
Jul. 13, 1988 [JP] Japan .................................. 63-174297

[51] Int. Cl.$^5$ ............................................ H03K 3/288
[52] U.S. Cl. .................................. 307/455; 307/272.2; 365/154
[58] Field of Search ............... 307/443, 455, 475, 480, 307/494, 269, 272.2; 365/154

[56] References Cited

U.S. PATENT DOCUMENTS

| | | | |
|---|---|---|---|
| 4,513,283 | 4/1985 | Leininger | 307/455 X |
| 4,626,706 | 12/1986 | Allen et al. | 307/455 X |
| 4,628,217 | 12/1986 | Berndt | 307/455 X |
| 4,810,908 | 3/1989 | Suzuki et al. | 307/480 |
| 4,891,531 | 1/1990 | Kobayashi et al. | 307/455 X |

FOREIGN PATENT DOCUMENTS 0176872 of 1986 Japan .
0018818 of 1987 Japan .

*Primary Examiner*—David Hudspeth
*Attorney, Agent, or Firm*—Staas & Halsey

[57] ABSTRACT

An ECL latch circuit comprises a data input part and a latch part. The data input part includes input transistors coupled in parallel and having bases for respectively receiving an input data and a clock signal, and an output transistor applied with a reference voltage. The data input part samples the input data responsive to the clock signal and outputs a level shifted data signal from a collector of the output transistor. The latch part includes a transistor which has a base for receiving the same clock signal, an emitter coupled transistor pair having bases respectively applied with the reference signal and an output signal of the ECL latch circuit, and a transistor having a base coupled to the collector of the output transistor and an emitter coupled to the base of the latter of the transistor pair.

20 Claims, 17 Drawing Sheets

DATA INPUT PART 51    LATCH PART 52

4,970,417

EMITTER COUPLED LOGIC LATCH CIRCUIT

BACKGROUND OF THE INVENTION

1. Field of the Invention

The present invention generally relates to emitter coupled logic (ECL) latch circuits, and more particularly to an ECL latch circuit (current switching type) which is suited for use in a high-speed logic circuit of a computer or the like. Particularly, the present invention relates to an ECL latch circuit which requires only a single clock signal.

2. Description of the Related Art

FIG. 1 shows an example of a conventional ECL latch circuit. In FIG. 1, the ECL latch circuit is made up of a data input part 1 and a latch part 2. The data input part 1 includes transistors TR1 through TR4, resistors R1 and R2 and a diode Di. The latch part 2 includes transistors TR5 through TR9 and resistors R3 through R5. $V_{EE}$ denotes a power source voltage for the current switch, $V_{TT}$ denotes a power source voltage for the emitter follower end, $V_{BB}$ denotes a reference voltage, $V_{CS}$ denotes a constant current control voltage, GND denotes ground, D denotes an input data to the ECL latch circuit, Q denotes an output signal of the ECL latch circuit, CLK denotes a positive clock signal which is applied to a base of the transistor TR5 and $\overline{CLK}$ denotes a negative clock signal which is applied to a base of the transistor TR1.

A description will be given of an operation of the ECL latch circuit shown in FIG. 1 by referring to FIGS. 2(A) through 2(D). The ECL latch circuit samples the input data D shown in FIG. 2(A) when the negative clock signal $\overline{CLK}$ shown in FIG. 2(B) is "0" and holds the sampled value when the negative clock signal $\overline{CLK}$ is "1". When the negative clock signal $\overline{CLK}$ applied to the transistor TR1 of the data input part 1 is "0", the transistor TR3 turns ON when the input data D is "0". In this state, a low-level collector voltage of the transistor TR3 is applied to a base of the transistor TR9 of the latch part 2. Thus, the level of the output signal Q of the transistor TR9 shown in FIG. 2(D) becomes low and the transistor TR6 turns OFF. The positive clock signal CLK shown in FIG. 2(C) is "1" in this state, and hence the transistor TR5 turns ON and the transistor TR7 turns OFF. When the positive clock signal CLK next changes to "0", the transistors TR5 and TR6 turn OFF, the transistor TR7 turns ON and this state is maintained.

On the other hand, when the negative clock signal $\overline{CLK}$ applied to the transistor TR1 is "0" and the input data D is "1", the transistor TR2 turns ON and the transistor TR3 turns OFF. In addition, the transistor TR5 is ON because the positive clock signal CLK is "1" in this state, and the transistor TR7 turns OFF. As a result, the output signal Q of the transistor TR9 has a high level and the transistor TR6 is ON. Even when the positive clock signal CLK next changes to "0", the transistor TR7 is maintained in the OFF state because the transistor TR6 is ON.

FIG. 3 shows a bipolar clock driver which is used to generate the positive and negative clock signals CLK and $\overline{CLK}$ which are applied to the ECL latch circuit shown in FIG. 1.

However, according to the conventional ECL latch circuit, there is a problem in that it is necessary to independently apply the negative clock signal $\overline{CLK}$ to the data input part 1 and the positive clock signal CLK to the latch part 2. For this reason, it is necessary to use the bipolar clock driver shown in FIG. 3 to generate the required positive and negative clock signals CLK and $\overline{CLK}$. Furthermore, a difference is introduced between delay times of the positive and negative clock signals CLK and $\overline{CLK}$ caused by differences in the lengths of interconnections and capacitances of the interconnections and there is a problem in that this difference in the delay times causes an unstable operation of the ECL latch circuit.

On the other hand, there are scan-in/scan-out type ECL latch circuits which are used for testing logic and control circuits of an integrated circuit. Such a scan-in/scan-out type ECL latch circuit is assembled within an ECL large scale integrated (LSI) circuit, and a value is written in a scan-in mode and a value is read out in a scan-out mode by designating an address.

FIG. 4 shows an example of a conventional scan-in/scan-out type ECL latch circuit. An LSI circuit 11 comprises scan-in/scan-out type ECL latch circuits 12, 13 and 14. A test value is written into each of the latch circuits 12, 13 and 14 via a common scan-in signal line 15. A value is read out from one of the latch circuits 12, 13 and 14 via a common scan-out signal line 16. An address for selecting one of the latch circuits 12, 13 and 14 to which the scan-in is to be made or from which the scan-out is to be made is supplied to the latch circuits 12, 13 and 14 via an address line 17.

While the LSI circuit 11 is operating, the values in the latch circuits 12, 13 and 14 successively change based on the original control or logic function thereof. Mutually different addresses are assigned to the latch circuits 12, 13 and 14. When a scan address is input from the address line 17, one of the latch circuits 12, 13 and 14 which is assigned the same scan address is selected and a value is read out from this one latch circuit and supplied to the scan-out signal line 16. On the other hand, when a test value is input from the scan-in signal line 15, the test value is written into one of the latch circuits 12, 13 and 14 which is selected by the address input from the address line 17. Hence, it is possible to operate the LSI circuit 11 from an arbitrary control or logic state.

FIG. 5 shows a circuit diagram of the scan-in/scan-out type ECL latch circuit shown in FIG. 4. The circuit part shown in FIG. 5 comprises a latch circuit 18, 3-input NOR gates 19 and 20, and decoders 21 and 22. The lower significant bits A0 through A2 of a 6-bit address signal are applied to the decoder 21 while the higher significant bits A3 through A5 of the 6-bit address signal are applied to the decoder 22. A 2-bit latch selection signal is applied to the NOR gate 19, where a bit $\overline{AD1}$ of the latch selection signal is obtained from the decoder 21 and a bit $\overline{AD2}$ of the latch selection signal is obtained from the decoder 22. The NOR gate 19 is also supplied with a scan-in signal $\overline{SI}$. An output signal of the NOR gate 19 is applied to a set terminal S of the latch circuit 18. A reset signal RESET is applied to a reset terminal R of the latch circuit 18. A Q-output signal of the latch circuit 18 is supplied to the NOR gate 20 which is also supplied with the bits $\overline{AD1}$ and $\overline{AD2}$ of the latch selection signal.

The decoders 21 and 22 respectively convert three bits of the address signal into one of eight possible output signals. A latch selection signal for selecting each of the latch circuits is generated by mutually different combinations of the output signals obtained from the decoders 21 and 22. Sixty-four different latch selection signals can be generated from the 6-bit address signal, and it is thus possible to scan up to sixty-four latch circuits.

When the bits $\overline{AD1}$ and $\overline{AD2}$ of the latch selection signal are both "0" in FIG. 5, the NOR gates 19 and 20 open and invert the respective signals $\overline{SI}$ and Q. Hence, a signal SI is output from the NOR gate 19 and a signal $\overline{Q}$ is output from the NOR gate 20. The signal SI is applied to the set terminal S of the latch circuit 18 and sets the value in the latch circuit 18 to a predetermined value. Before such a signal SI is applied to the set terminal S of the latch circuit 18, all of the latch circuits within the LSI circuit are initialized responsive to the reset signal RESET which is a positive polarity pulse so that the Q-outputs of the latch circuits become "0". The Q-output of the selected latch circuit 18 is output as a scan-out signal $\overline{SO}$ via the NOR gate 20.

But according to the conventional scan-in/scan-out type ECL latch circuit, two gates are required for each latch circuit because the scan-in signal $\overline{SI}$ and the scan-out signal $\overline{SO}$ are gate-controlled. For this reason, there is a problem in that the hardware and cost of the LSI circuit increases considerably with the increase in the number of scan-in/scan-out latch circuits provided within the LSI circuit.

On the other hand, there are ECL master-slave latch circuits constituted by ECL gates. However, when the ECL gates are used to constitute the ECL master-slave latch circuit, the required number of gates becomes considerably large. As a result, there is a limit to the scale of the logic functions which may be realized within one LSI circuit.

FIG. 6 shows an example of a conventional master-slave ECL latch circuit. The master-slave ECL latch circuit is made up of a master latch 31 and a slave latch 32. The master latch 31 includes an OR gate 33, an OR/NOR gate 34, a collector dot AND gate 35 and a NOR gate 36. The slave latch 32 includes NOR gates 37 and 38.

All of the gates 33, 34, 36, 37 and 38 are normal ECL OR/NOR circuits. In addition, the collector dot AND gate 35 can be realized by coupling the collectors of transistors which constitute the AND gate 35.

In FIG. 6, the input data D is supplied to the OR gate 33 of the master latch 31 together with the negative clock signal $\overline{CLK}$. The negative clock signal $\overline{CLK}$ is also supplied to the NOR gate 36 of the master latch 31 and the NOR gate 37 of the slave latch 32. Hence, the master latch 31 enters and samples the value of the input data D when the negative clock signal $\overline{CLK}$ is "0", and the master latch 31 holds the value "0" when the negative clock signal $\overline{CLK}$ changes from "0" to "1". On the other hand, the slave latch 32 enters and samples the value of the $\overline{Q}$-output of the master latch 31 when the negative clock signal $\overline{CLK}$ is "1", and the slave latch 32 holds the data SLQ ($\overline{Q}$-output signal which is inverted by NOR gate 38) when the negative clock signal $\overline{CLK}$ changes from "1" to "0".

In other words, when the value of the negative clock signal $\overline{CLK}$ is "0" and the value of the input data D changes from "0" to "1", the master latch 31 enters and samples the value "1" of the input data D via the AND gate 35, and the master latch 31 holds the value "1" when the negative clock signal $\overline{CLK}$ changes from "0" to "1". In this state, the $\overline{Q}$-output of the master latch 31 output from the OR/NOR gate 34 has a value "0" and is supplied to the NOR gate 38 of the slave latch 32. The output signal SLQ of the slave latch 32 becomes "1" (at this time the negative clock signal $\overline{CLK}$ is "1" and the input signals of the NOR gate 38 are both "0") and when the negative clock signal $\overline{CLK}$ changes from "1" to "0", this value "1" is held in the slave latch 32. The operation is similar when the value of the input data changes from "1" to "0".

FIG. 7 shows another example of a conventional master-slave ECL latch circuit with the scan-in/scan-out function. The master-slave ECL latch circuit shown in FIG. 7 is based on the master-slave ECL latch circuit shown in FIG. 6 and is supplemental with the scan-in/scan-out function. In FIG. 7, those parts which are substantially the same as those corresponding parts in FIG. 6 are designated by the same reference numerals, and a description thereof will be omitted.

In FIG. 7, a scan-in/scan-out circuit 39 comprises OR/NOR gates 40 and 42, OR gates 41 and 44, and a collector dot AND gate 43 respectively using ECL. In this example, an output signal of the OR gate 44 is not used.

Input data D1 and D2 are supplied to the OR gate 33 of the master latch 31, and the OR/NOR gate 34 can receive a set signal SET. The negative clock signal $\overline{CLK}$ and a clock enable signal $\overline{CE}$ are supplied in parallel to the master latch 31 and the slave latch 32.

Latch selection signals $\overline{AD1}$ and $\overline{AD2}$ which are generated based on the latch address are supplied to the scan-in/scan-out circuit 39. When the latch selection signals $\overline{AD1}$ and $\overline{AD2}$ are both "0", the scan-in signal SI is supplied to the master latch 31 via the OR gate 41 and the state of the slave latch 32 is read out from the AND gate 43 as a scan-out signal $\overline{SOUT}$.

Next, a description will be given of a case where an LSI circuit having such a master-slave ECL latch circuit with the scan-in/scan-out function is tested. For example, a set signal SET having a value "1" is supplied to each of the master-slave ECL latch circuits within the LSI circuit to set the value "1" in all of the master-slave ECL latch circuits. Then, an address of the master-slave ECL latch circuit to be selected is designated and the value of the scan-in signal SI is set to "1" so as to invert the value in the selected master-slave ECL latch circuit to "0". Thereafter, the address of the selected master-slave ECL latch circuit is designated so as to read out the state of the selected master-slave ECL latch circuit as the scan-out signal SOUT. The result of the test is diagnosed based on the scan-out signal $\overline{SOUT}$.

But according to the conventional master-slave ECL latch circuit using ECL and the master-slave ECL latch circuit using ECL and having the scan-in/scan-out function, a large number of ECL gates are required and there is a problem in that the scale of the circuit becomes large in order to realize a desired logic function. As a result, in a master slice LSI, the logic functions which may be realized by a predetermined number of gates become limited. This means that the utilization efficiency of the master slice LSI becomes poor and the cost of the LSI circuit increases thereby.

SUMMARY OF THE INVENTION

Accordingly, it is a general object of the present invention to provide a novel and useful ECL latch circuit in which the problems described above are eliminated.

Another and more specific object of the present invention is to provide an ECL latch circuit comprising a first power source for supplying a first power source voltage, a second power source for supplying a second power source voltage, a third power source for supplying a third power source voltage, a data input part comprising first, second and third transistors having collectors coupled to the first power source and emitters coupled in common at a first node, and a first constant current source coupled between the first node and the second power source, the first, second and third transistors having bases respectively supplied with a clock signal, an input data and a reference voltage, and a latch part comprising a fourth transistor having a collector coupled to the collector of the third transistor at a second node and a base supplied with the clock signal, fifth and sixth transistors having collectors coupled in common to the first power source and emitters coupled in common to an emitter of the fourth transistor at a third node, a second constant current source coupled between the third node and the second power source, and a seventh transistor having a base coupled to the second node and a collector and an emitter respectively coupled to the first and third power sources, the fifth transistor having a base supplied with the reference voltage, the sixth transistor having a base connected to the emitter of the seventh transistor at a fourth node from which an output signal of the ECL latch circuit is obtained. According to the ECL latch circuit of the present invention, it is only necessary to use a single clock signal. Hence, the required interconnections are simple and the operation of the ECL latch circuit is stable compared to the conventional ECL latch circuit.

Still another object of the present invention is to provide an ECL latch circuit of the type described above wherein the data input part further comprises an eighth transistor having a collector coupled to the second node, an emitter coupled to the first node and a base for receiving a reset signal, and the latch part further comprises a ninth transistor having a collector coupled to the collectors of the fifth and sixth transistors, an emitter coupled to the third node and a base for receiving a set signal. According to the ECL latch circuit of the present invention, it is possible to realize stable set and reset functions.

A further object of the present invention is to provide an ECL latch circuit of the first type described above wherein the latch part further comprises an eighth transistor having a collector coupled to the collectors of the fifth and sixth transistors at a fifth node, an emitter coupled to the third node and a base for receiving a set signal, and the ECL latch circuit further comprises a scan-in/scan-out circuit comprising a ninth and tenth transistors having collectors coupled to the first power source, bases respectively supplied with a scan-in signal and the reference voltage, and emitters coupled in common to a sixth node, one or a plurality of eleventh transistors having collectors coupled in common to the first power source via the fifth node, bases respectively supplied with a bit of a latch selection signal, and emitters coupled in common to the sixth node, a third constant current source coupled between the sixth node and the second power source, and a twelfth transistor having a collector coupled to the first power source, a base coupled to the fifth node, and an emitter coupled to the third power source, an output scan-out signal of the scan-in/scan-out circuit being obtained from the emitter of the twelfth transistor. According to the ECL latch circuit of the present invention, the scan-in/scan-out circuit can be realized by a single ECL gate.

Another object of the present invention is to provide an ECL latch circuit of the first type described above wherein the data input part further comprises an eighth transistor having a collector coupled to the second node, an emitter coupled to the first node and a base for receiving a reset signal, the latch part further comprises a ninth transistor having a collector coupled to the collectors of the fifth and sixth transistors, an emitter coupled to the third node and a base for receiving a set signal, a tenth transistor having a collector and an emitter respectively coupled to the first and third power sources and a base coupled to the collectors of the fifth and sixth transistors, an inverted signal of the output signal of the ECL latch circuit being obtained from the emitter of the tenth transistor, the data input part and the latch part constituting a master latch, and the emitter coupled logic latch circuit further comprises a slave latch comprising eleventh and twelfth transistors having collectors coupled in common to the first power source, emitters coupled in common to a fifth node, and bases respectively supplied with the clock signal and a predetermined signal, thirteenth and fourteenth transistors having collectors coupled in common to the first power source, emitters coupled in common to the fifth node, and bases respectively supplied with the reference voltage and the inverted signal, a third constant current source coupled between the fifth node and the second power source, fifteenth and sixteenth transistors having collectors coupled to the first power source, emitters coupled to the third power source, and bases respectively coupled to the collectors of the eleventh and twelfth transistors and the collectors of the thirteenth and fourteenth transistors, and a voltage divider coupled between the emitter of the sixteenth transistor and the third power source, complementary output signals of the slave latch being obtained from the emitters of the fifteenth and sixteenth transistors, the predetermined signal being obtained from the voltage divider. According to the ECL latch circuit of the present invention, it is possible to realize a master-slave latch circuit using three ECL gates.

Other objects and further features of the present invention will be apparent from the following detailed description when read in conjunction with the accompanying drawings.

BRIEF DESCRIPTION OF THE DRAWINGS

FIGS. 2(A) through 2(D) show signal waveforms for explaining an operation of the latch circuit shown in FIG. 1;

DESCRIPTION OF THE PREFERRED EMBODIMENTS

Figure 1:
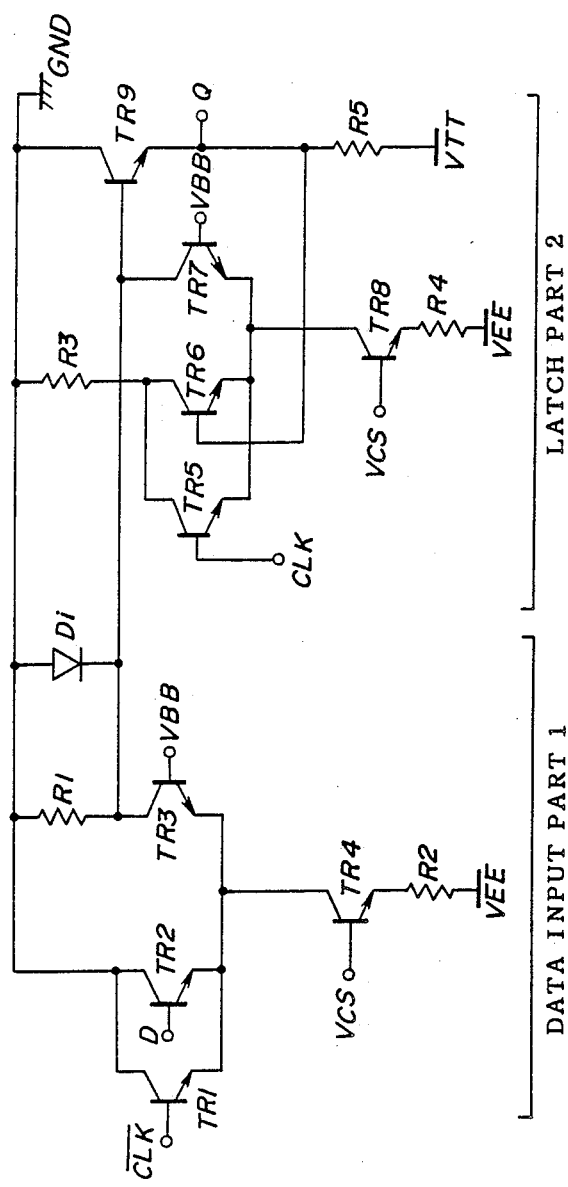
FIG. 1 is a circuit diagram showing an example of a conventional ECL latch circuit.
Figures 2, 3:
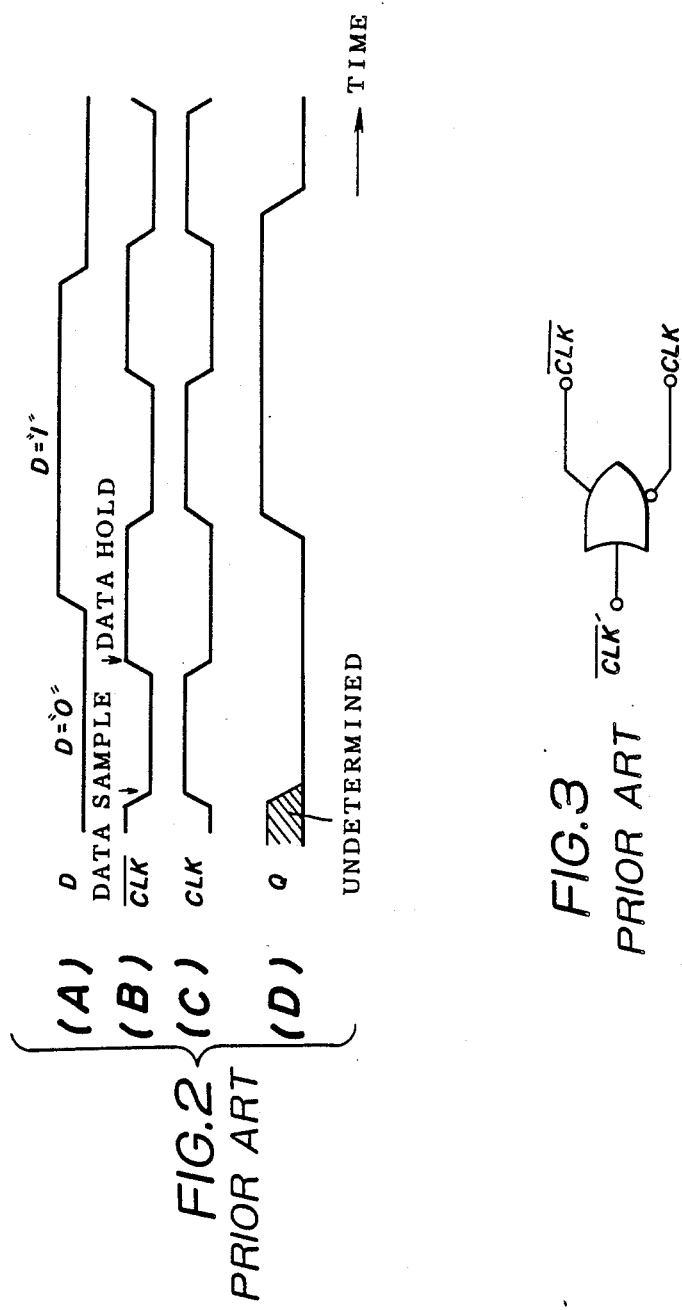
FIG. 3 shows a bipolar clock driver which is used to generate positive and negative clock signals applied to the latch circuit shown in FIG. 1.
Figure 4:
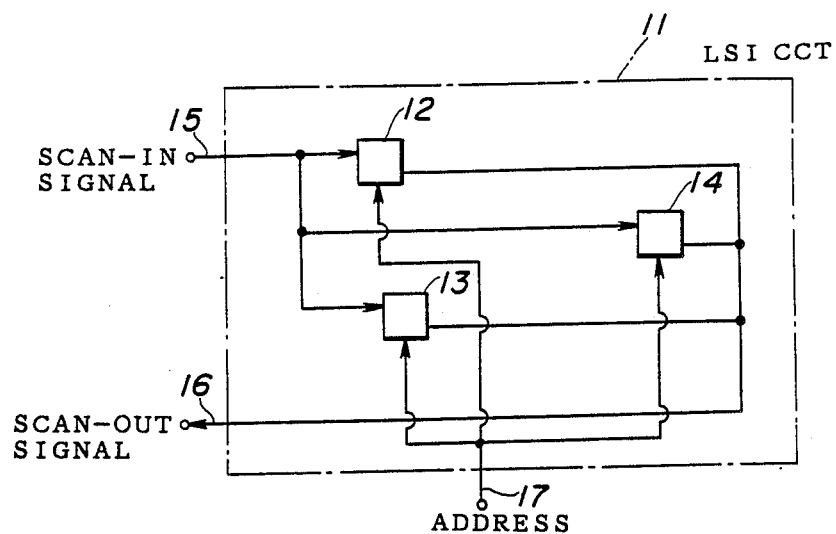
FIG. 4 is a block diagram showing an example of a conventional scan-in/scan-out type ECL latch circuit.
Figure 5:
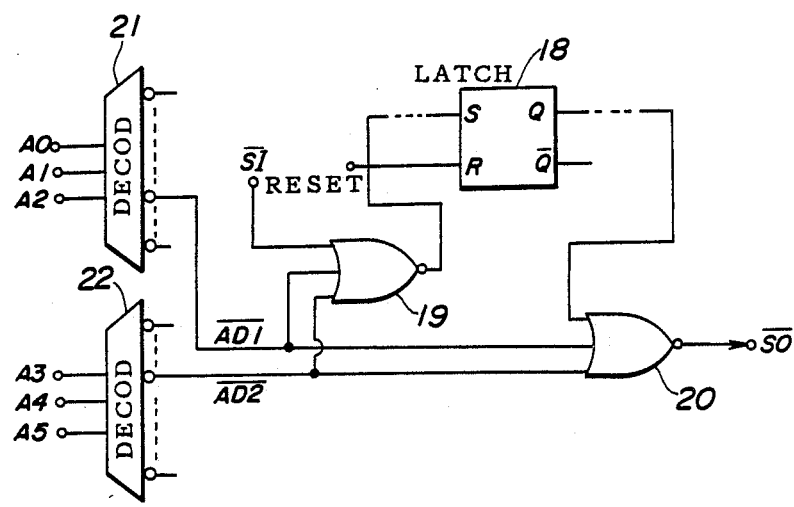
FIG. 5 is a circuit diagram showing the scan-in/scan-out type ECL latch circuit shown in FIG. 4.
Figure 6:
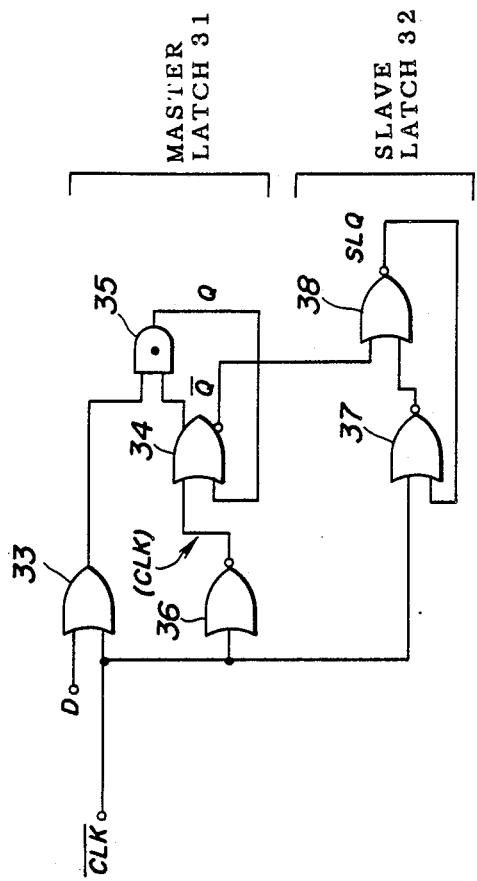
FIG. 6 is a circuit diagram showing an example of a conventional master-slave ECL latch circuit.
Figure 7:
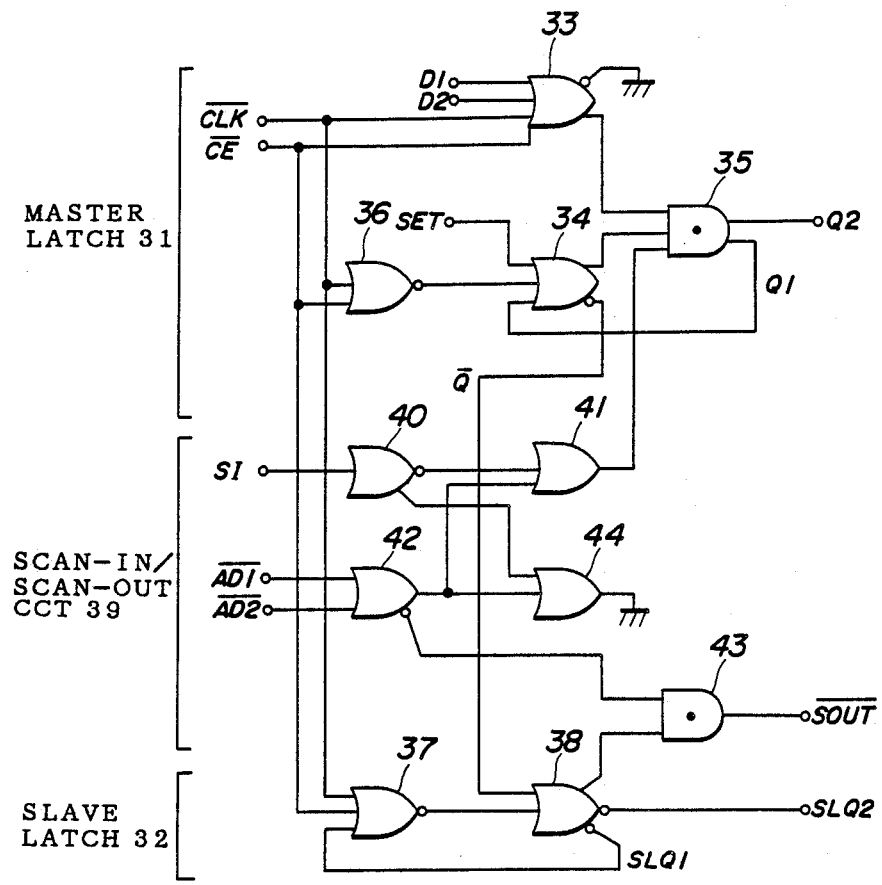
FIG. 7 is a circuit diagram showing an example of a conventional master-slave ECL latch circuit with the scan-in/scan-out function.
Figure 8:
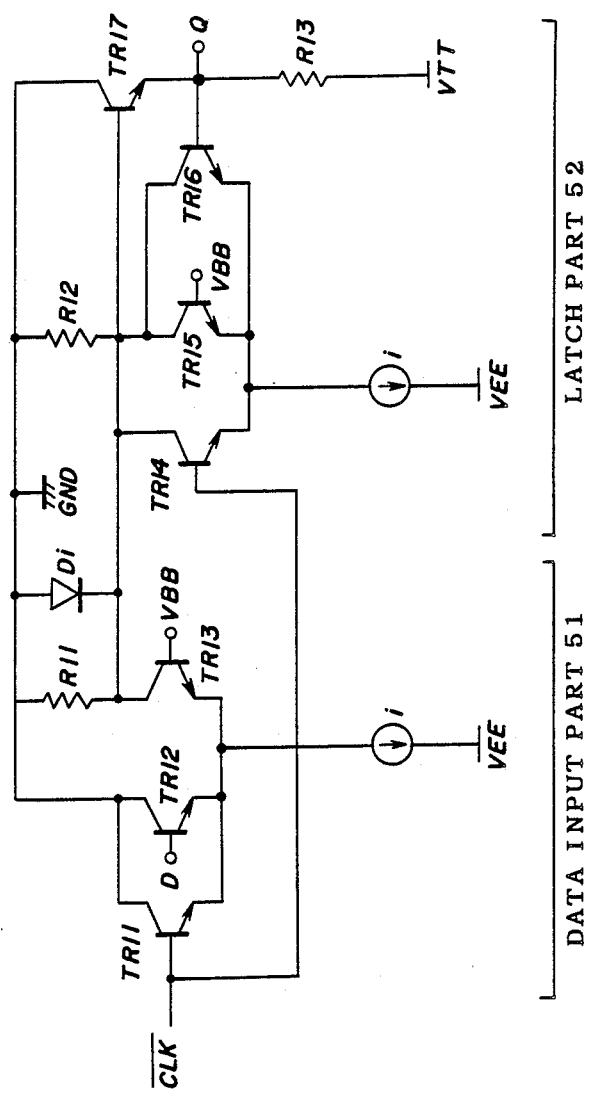
FIG. 8 is a circuit diagram showing a first embodiment of an ECL latch circuit according to the present invention.

A description will now be given of a first embodiment of an ECL latch circuit according to the present invention, by referring to FIG. 8. In FIG. 8, the ECL latch circuit is made up of a data input part 51 and a latch part 52. The data input part 51 comprises transistors TR11 through TR13, a resistor R11, a diode Di, and a constant current source i. The latch part 52 comprises transistors TR14 through TR17, resistors R12 and R13, and a constant current source i. $V_{EE}$ and $V_{TT}$ denote power source voltages $V_{BB}$ denotes a reference voltage, GND denotes the ground, D denotes input data to the ECL latch circuit, Q denotes a output signal of the ECL latch circuit, $\overline{CLK}$ denotes a negative clock signal which is applied to bases of the transistors TR11 and TR14. For example $V_{EE} = -3.6$ V, $V_{TT} = -2.0$ V, and $V_{BB} = -1.3$ V.

A pair of current switching paths is formed in the data input part 51. A first current switching path is formed by the transistors TR11 and TR12 which are coupled in parallel. The transistor TR11 is supplied with the negative clock signal $\overline{CLK}$ and the transistor TR12 is supplied with the input data D. A second current switching path is formed by the transistor TR13 which is supplied with the reference voltage $V_{BB}$. When at least one of the signals supplied to the transistors TR11 and TR12 of the first current switching path becomes "1", the transistor (TR11 or TR12) supplied with the signal "1" turns ON and turns OFF the transistor TR13 of the second current switching path. A signal from a collector of the transistor TR13 is supplied to the latch part 52.

A pair of current switching paths is formed in the latch part 52. A third current switching path is formed by the transistor TR14 which has a collector coupled to a collector of the transistor TR13 (collector dot). The transistor TR14 is also supplied with the negative clock signal $\overline{CLK}$. A base of the transistor T17 which obtains both the Q-output signal and a feedback signal is connected to the collector of the transistor TR14. A fourth current switching path is formed by a parallel connection of the transistors TR15 and TR16. The transistor TR15 is supplied with the reference voltage $V_{BB}$ and the transistor TR16 is supplied with the feedback signal.

The transistor TR17 constitutes an emitter follower, and the Q-output signal is obtained from the emitter of the transistor TR17. The Q-output signal is supplied to a base of the transistor TR16 as the feedback signal.

Figure 9:
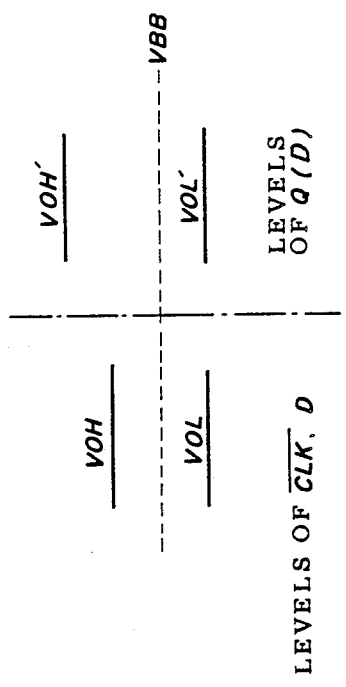
FIG. 9 is a diagram for explaining signal levels used in the first embodiment.

As shown in FIG. 9, the level of the Q-output signal is shifted from the level of the negative clock signal $\overline{CLK}$. In other words, a high level VOH' of the Q-output signal is higher than a high level VOH of the negative clock signal $\overline{CLK}$. On the other hand, a low level VOL' of the Q-output signal is the same as a low level VOL of the signals $\overline{CLK}$ and D. For this reason, when the high level VOH' of the Q-output signal is applied to the base of the transistor TR16, the transistor TR16 is turned ON and the transistor TR14 is turned OFF because the high level VOH' of the Q-output signal is higher than the high level VOH of the negative clock signal $\overline{CLK}$ which is applied to the base of the transistor TR14. As a modification, the high and low levels of the input data D may respectively be set to VOH' and VOL'.

Figure 10:
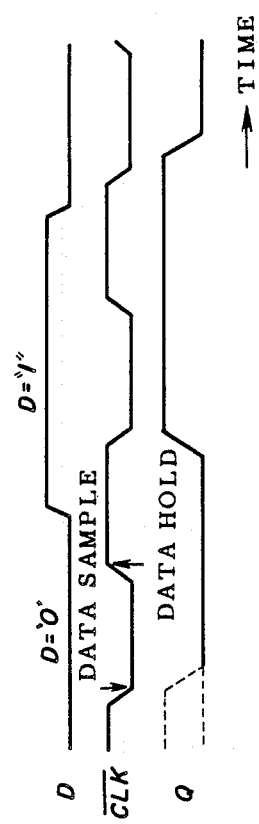
FIGS. 10(A) through 10(C) show signal waveforms for explaining an operation of the first embodiment.

Next, a description will be given of the operation of the ECL latch circuit shown in FIG. 8 by referring to FIGS. 10(A) through 10(C). When the negative clock signal $\overline{CLK}$ shown in FIG. 10(B) is "0", the data input part 51 samples the input data D shown in FIG. 10(A) and the level of the sampled input data D is held in the latch part 52 when the negative clock signal $\overline{CLK}$ is "1". In other words, if the input data D is "0" when the negative clock signal $\overline{CLK}$ is "0", the transistors TR11 and TR12 both turn OFF and the transistor TR13 turns ON. In this state, the transistor TR14 is OFF, and as a result, the Q-output signal shown in FIG. 10(C) takes the low level VOL' and the transistor TR16 turns OFF and the transistor TR15 turns ON. When the negative clock signal $\overline{CLK}$ changes to "1", the transistor TR11 turns ON, the transistor TR13 turns OFF, and the transistor TR14 turns ON. For this reason, the low level VOL' of the Q-output signal, that is, the value "0", is held in the latch part 52.

On the other hand, if the input data D is "1" when the negative clock signal $\overline{CLK}$ is "0", the transistor TR11 turns OFF, the transistor TR12 turns ON and the transistor TR13 turns OFF. In this state, the transistor TR14 is OFF, and as a result, the Q-output signal shown in FIG. 10(C) takes the high level VOH' and the transistor TR16 turns ON. When the negative clock signal $\overline{CLK}$ changes to "1", the transistor TR11 turns ON and the transistor TR13 is kept OFF. The high level VOH of the negative clock signal $\overline{CLK}$ is applied to the transistor TR14 but the high level VOH' of the Q-output signal applied to the transistor TR16 is dominant. For this reason, the transistor TR16 is kept ON and the transistor TR14 is kept OFF. That is, the value "1" is latched in the latch part 52.

Figure 11:
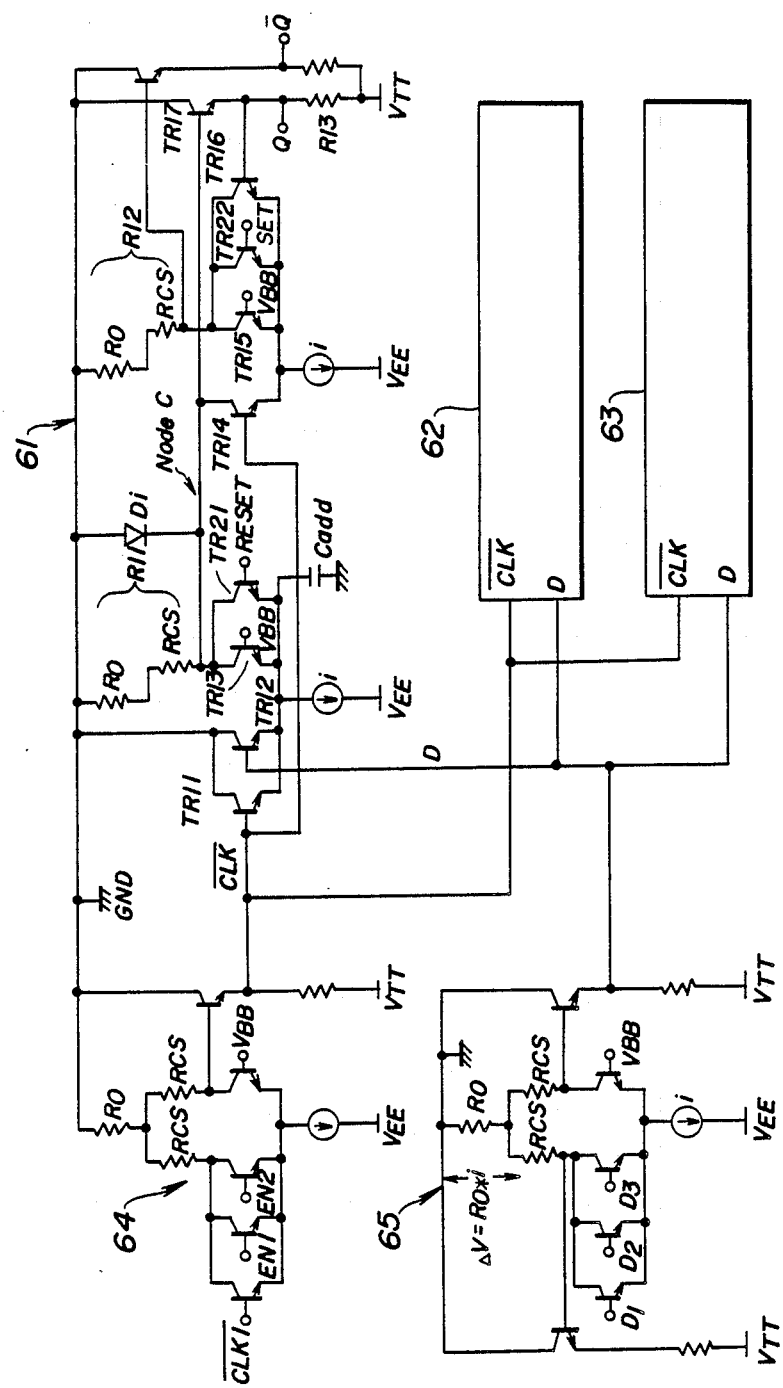
FIG. 11 is a circuit diagram showing an LSI circuit including the first embodiment.

FIG. 11 shows an LSI circuit applied with the first embodiment. In FIG. 11, those parts which are substantially the same as those corresponding parts in FIG. 8 are designated by the same reference numerals, and a description thereof will be omitted. In FIG. 11, the LSI circuit comprises ECL latch circuits 61, 62 and 63, a 3-input OR circuit 64, and a 3-input OR/NOR circuit 65. The ECL latch circuits 61 through 63 have identical circuit constructions and only the circuit construction of the ECL latch circuit 61 is shown for the sake of convenience. The ECL latch circuits 61 through 63 are basically the same as the first embodiment shown in FIG. 8 except that the ECL latch circuits 61 through 63 have set and reset functions and also generate a $\overline{Q}$-output signal which is an inverted signal of the Q-output signal.

A reset signal RESET, a set signal SET and the Q-output signal have levels identical to those of the Q-output signal shown in FIG. 9. The high level VOH' of the signals RESET, SET and Q is higher than the high level VOH of the signals $\overline{CLK}$ and D. The reset signal RESET is "1" when the signals $\overline{CLK}$ and SET respectively are "1" and "0" and makes the Q-output signal "0". The set signal SET is "1" when the signals $\overline{CLK}$ and RESET respectively are "1" and "0" and makes the Q-output signal "1".

A clock signal $\overline{CLK1}$ supplied to the OR circuit 64 is used to generate the negative clock signal $\overline{CLK}$. Enable signal EN1 and EN2 supplied to the OR circuit 64 are used for controlling the clock input. The OR circuit 64 supplies the negative clock signal $\overline{CLK}$ to the ECL latch circuits 61 through 63 when the enable signals EN1 and EN2 are both "0".

Data D1, D2 and D3 supplied to the OR/NOR circuit 65 are used to generate the input data D. The OR/NOR circuit 65 carries out an OR operation D=D1+D2+D3 and supplies the input data D to the ECL latch circuits 61 through 63.

The OR circuit 64 and the OR/NOR circuit 65 are non-level shift type circuits. The OR circuit 64 and the OR/NOR circuit 65 respectively have a resistor Ro for introducing a level shift $\Delta V = Ro \cdot i$. In the case of the master slice LSI, the resistor Ro is provided as an element resistance together with a collector resistor RCS.

On the other hand, the ECL latch circuits 61 through 63 are level shift type circuits. The resistors Ro and RCS are provided in only one of the two current switching paths in each of the data input part and the latch part of the ECL latch circuit. Hence, when making the ECL latch circuit in the master slice LSI, it is possible to use common resistors for the level shift type circuits and the non-level shift type circuits such as the OR and NOR circuits described above, and there is no need to provide special resistors having special resistances.

When the negative clock signal $\overline{CLK}$ is "1" and the reset signal RESET is "1" in the ECL latch circuit 61, the transistors TR14 and TR21 turn ON simultaneously and a potential drop (Ro+RCS)·2i tends to occur at a node C which connects collectors of the transistors TR14 and TR21. In this case, the collector potentials of the transistors TR14 and TR21 become lower than respective base potentials and a saturation phenomenon occurs in a forward direction of the base-collector of each of the transistors TR14 and TR21. The diode Di is provided to prevent an excessive potential drop at the node C. An extra transistor of the master slice LSI for making an emitter follower may be used for the diode Di.

In the signal waveforms shown in FIGS. 10(A) through 10(C) described before, the negative clock signal $\overline{CLK}$ changes from "0" to "1" at a data holding point where the value "0" of the input data D is held. Accordingly, the state of a transistor TR11 shown in FIG. 11 changes from OFF to ON, the state of a transistor TR13 changes from ON to OFF, and the state of the transistor TR14 changes from OFF to ON. The operation of the transistors TR13 and TR14 become opposite with respect to the node C, but it is possible to hold the value "0" of the input data D because the potential at the node C cannot respond instantaneously due to the stray capacitance of the transistors and interconnections connected to the node C. If necessary, it is possible to connect a capacitor to the node C or the emitter interconnection of the transistor TR21 so as to make an appropriate timing adjustment. In FIG. 11, a capacitor Cadd is such a capacitor connected to the emitter interconnection of the transistor TR21.

According to the first embodiment described heretofore, the ECL latch circuit only requires a single clock signal. For this reason, the construction of the clock driver for generating the clock signal becomes simple, and the interconnections related to the ECL latch circuit can be simplified compared to the conventional case where two clock signals are required. Moreover, the operation of the ECL latch circuit is stable compared to the conventional ECL latch circuit.

Figure 12:
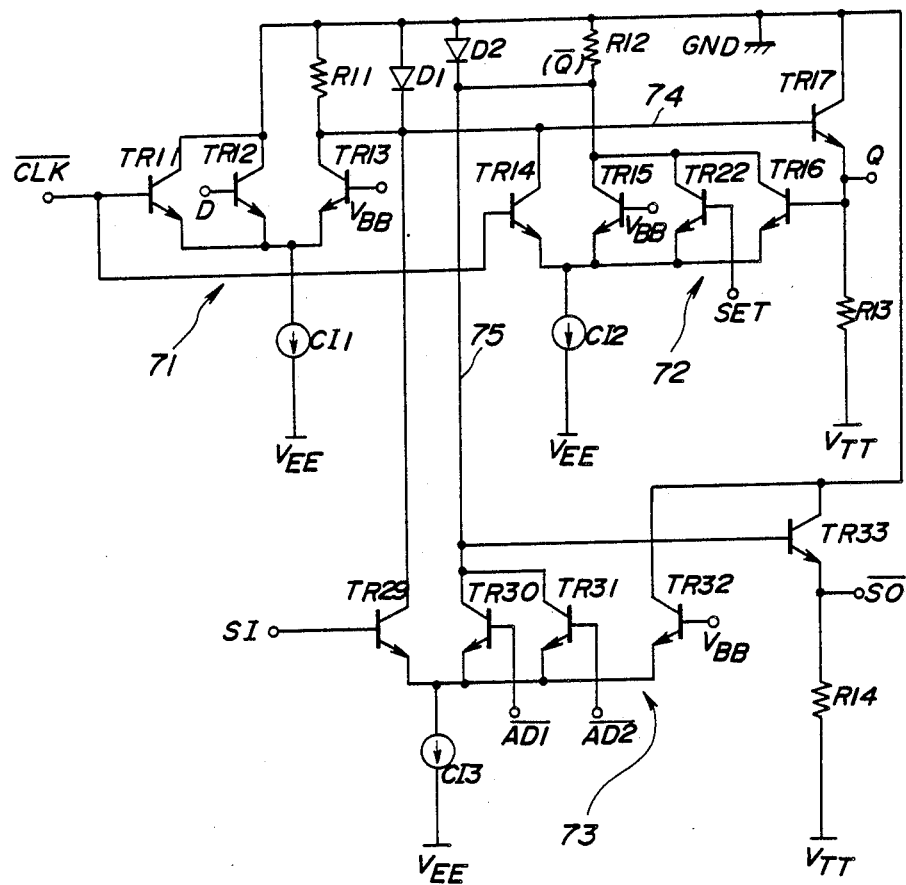
FIG. 12 is a circuit diagram showing a second embodiment of the ECL latch circuit according to the present invention.
Figure 13:
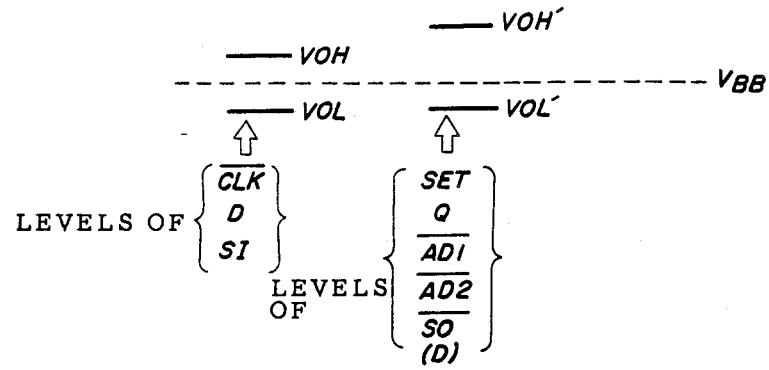
FIG. 13 is a diagram for explaining signal levels used in the second embodiment.

Next, a description will be given of a second embodiment of the ECL latch circuit according to the present invention, by referring to FIG. 12. In this embodiment, the ECL latch circuit has the scan-in/scan-out function. In FIG. 12, those parts which are substantially the same as those corresponding parts in FIGS. 8 and 11 are designated by the same reference numerals. FIG. 13 is a diagram for explaining the signal levels used in this embodiment.

In FIG. 12, the ECL latch circuit comprises a data input part 71, a latch part 72, and a scan-in/scan-out part 73. A node 74 couples the collectors of the transistors (collector dot) in the data input part 71, the latch part 72 and the scan-in/scan-out part 73. A node 75 couples the collectors of the transistors (collector dot) in the latch part 72 and the scan-in/scan-out part 73. A diode D1 is connected between the node 75 and the ground GND, and a diode D2 is connected between the node 74 and the ground GND. CI1, CI0 and CI3 denote constant current sources.

As shown in FIG. 13, the high level VOH' of the signals SET, Q, $\overline{AD1}$, $\overline{AD2}$ and $\overline{SO}$ is higher than the high level VOH of the signals $\overline{CLK}$, D and SI. However, the low level VOL' of the signals SET, Q, $\overline{AD1}$, $\overline{AD2}$ and $\overline{SO}$ is the same as the low level VOL of the signals $\overline{CLK}$, D and SI. As a modification, the high level VOH of the input data D may be set the same as the high level VOH' of the signals SET, Q, AD1, AD2 and $\overline{SO}$.

In the data input part 71, the transistors TR11 and TR12 which are coupled in parallel are respectively supplied with the signals $\overline{CLK}$ and D. The transistors TR11 and TR12 constitute a current switching path and subjects a logical sum of the signals $\overline{CLK}$ and D to a level shift and output the level shifted logical sum to the node 74. In other words, the high level (Q) of the signal at the node 74 is higher than the high level VOH of the signals $\overline{CLK}$ and D because there is no potential drop caused by a resistor which is coupled between the ground and the two current switching paths in the case of the non-level shift type ECL latch circuit.

In the latch part 72, the transistor TR14 which is supplied with the negative clock signal $\overline{CLK}$ constitutes a current switching path. The transistors TR15, TR22 and TR16 which are coupled in parallel are respectively supplied with the signals $V_{BB}$, SET and Q. The transistors TR15, TR22 and TR16 constitute another current switching path. The collector of the transistor TR14 is coupled to the base of the transistor TR16 through a feedback circuit which is constituted by the transistor TR17.

The scan-in/scan-out circuit 73 comprises transistors TR29 through TR33, a resistor R14 and a constant current source C13. In the scan-in/scan-out circuit 73, the transistor TR29, which is supplied with the scan-in signal SI, constitutes a first current switching path. The transistors TR30 and TR31 are coupled in parallel and are respectively supplied with the signals $\overline{AD1}$ and $\overline{AD2}$. The transistor TR32 is supplied with the reference voltage $V_{BB}$ and its emitter is coupled to the emitters of the transistors TR29 through TR31. The transistors TR30 and TR31 constitute a second current switching path, and the transistor TR32 constitutes a third current switching path. Collectors of the transistors TR30 and TR31 are coupled to the node 75, and a collector of the transistor TR32 is coupled to the ground GND. The transistor TR33 which constitutes an emitter follower has a base which is coupled to the node 75, and the scan-out signal $\overline{SO}$ is output from the transistor TR33.

A description will now be given of the operation of the ECL latch circuit shown in FIG. 12 by referring to signal waveforms shown in FIGS. 14(A) through 14(G). When carrying out a normal latch operation in which no scan-in/scan-out operation is made, the scan-in signal SI shown in FIG. 14(E) is "0" and the bits $\overline{AD1}$ and $\overline{AD2}$ ($\overline{AD1}+\overline{AD2}$) of the latch selection signal shown in FIG. 14(F) are both "1". Hence, the transistor TR29 is OFF and the transistors TR30 and TR31 are ON and the transistor TR32 is OFF. In addition, the set signal SET shown in FIG. 14(D) is "0".

Figure 14:
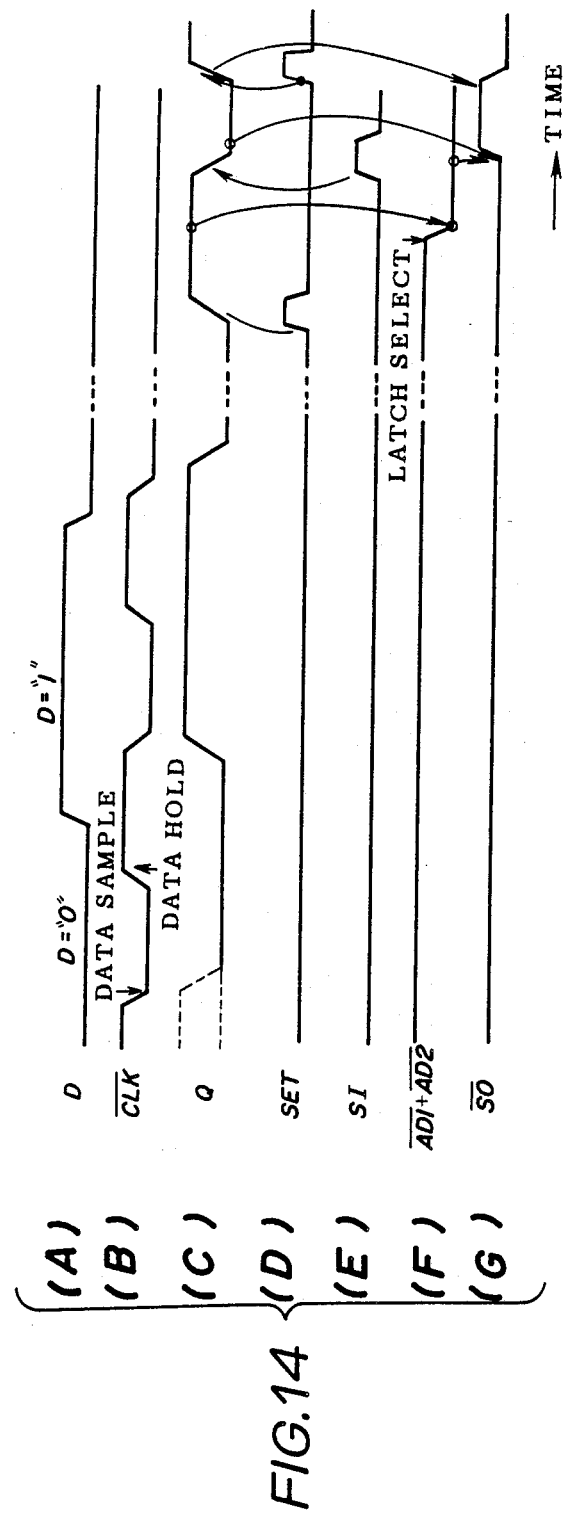
FIGS. 14(A) through 14(G) show signal waveforms for explaining an operation of the second embodiment.

When the input data D shown in FIG. 14(A) having a value "1" is supplied to the data input part 71 and the negative clock signal $\overline{CLK}$ shown in FIG. 14(B) is supplied to the data input part 71 and the latch part 72, a level shifted output is obtained at the node 74 when the negative clock signal $\overline{CLK}$ is "0". But the transistor TR14 is ON when the negative clock signal $\overline{CLK}$ is "1", and the level at the node 74 is maintained low even when the input data D is "1" For this reason, the value "1" is not latched in the latch part 72 while the negative clock signal $\overline{CLK}$ is "1", and the value in the latch part 72 becomes "1" when the negative clock signal $\overline{CLK}$ becomes "0" and the transistor TR14 turns OFF. That is, the Q-output signal shown in FIG. 14(C) becomes "1". This value "1" in the latch part 72 continues while the input data D is "1", and a positive feedback loop is formed in which the Q-output signal is "1", the transistor TR16 is ON and the transistor TR14 is OFF.

When the negative clock signal $\overline{CLK}$ changes to "1" in this state, the transistor TR13 remains OFF and the input to the transistor TR14 becomes "1". However, since the level of the Q-output signal having the value "1" is higher than the level of the negative clock signal $\overline{CLK}$ having the value "1", the transistor TR16 is maintained ON and the transistor TR14 is maintained OFF. Thus, the latch part 72 latches the value "1".

If the negative clock signal $\overline{CLK}$ becomes "0" when the input data D is "0", the transistor TR13 turns ON and the level at the node 74 becomes low. Thus, the transistor TR16 turns OFF but the transistor TR15 turns ON instead. The transistor TR14 turns OFF, but the level at the node 74 is maintained low because the transistor TR13 is ON. Next, when the negative clock signal $\overline{CLK}$ changes to "1", the transistors TR11 and TR14 turn ON, the transistors TR13, TR15, TR22 and TR16 turn OFF. Hence, the value "0" is latched in the latch part 72.

On the other hand, when the set signal SET is "1", the transistor TR14 turns OFF and the latch part 72 is forcibly changed to the state in which the value "1" is latched because the level of the set signal SET having the value "1" is higher than the level of the negative clock signal $\overline{CLK}$ having the value "1".

Next, when the bits $\overline{AD1}$ and $\overline{AD2}$ of the latch selection signal are both "0" and the ECL latch circuit is selected, the transistors TR30 and TR31 of the scan-in/scan-out circuit 23 turn OFF. In this state, the switching state of the transistors TR29 and TR30 is determined solely by the scan-in signal SI. When the scan-in signal SI applied to the transistor TR29 is "1", the transistor TR29 turns ON and a low-level signal is supplied to the latch part 72 via the node 74. Hence, a value "0" is written into the latch part 72 of the ECL latch circuit.

The scan-in operation is used together with the set operation. First, the set signal SET (positive polarity pulse) is applied to all of the ECL latch circuits within the LSI circuit before making the scan-in operation. As a result, the value "1" (that is, Q="1") is set in all of the ECL latch circuits within the LSI circuit. Thereafter, only the desired ECL latch circuits are successively selected and the value "0" which is opposite to the set value "1" is written into the selected ECL latch circuits by applying the scan-in signal SI.

The base of the transistor TR33 constituting the emitter follower is coupled to the node 75, and the $\overline{Q}$-output signal of the latch part 72 is output as the scan-out signal $\overline{SO}$ shown in FIG. 14(G). The latch part 72 constitutes the feedback loop for the Q-output signal. The $\overline{Q}$-output signal is normally "0" when the ECL latch circuit is not selected by the bits $\overline{AD1}$ and $\overline{AD2}$ of the latch selection signal, but this $\overline{Q}$-output signal does not cause undesirable effects on the latch operation. In addition, the level of the bits $\overline{AD1}$ and $\overline{AD2}$ having the value "1" is higher than the level of the scan-in signal SI having the value "1", and thus, the scan-in operation is made not responsive to the scan-in signal SI when one or both of the bits $\overline{AD1}$ and $\overline{AD2}$ are "1" indicating the non-selected state.

According to this embodiment, the scan-in and scan-out of the latch part 72 can be made by use of a single ECL gate, and the data can be written into the latch part 72 in response to a single clock signal $\overline{CLK}$. As a result, the hardware structure is simple and it is possible to improve the density of the gates within the LSI circuit and also reduce the cost of the LSI circuit.

Figure 15:
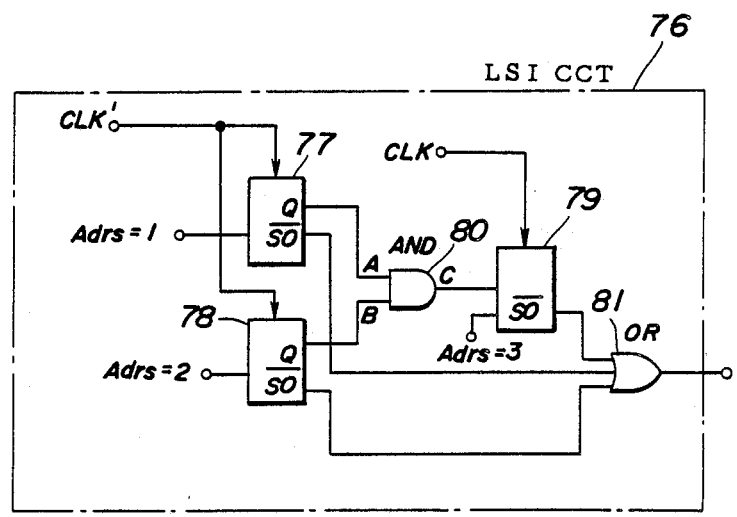
FIG. 15 is a circuit diagram showing an LSI circuit including the second embodiment.

FIG. 15 shows an LSI circuit including the second embodiment. In FIG. 15, an LSI circuit 76 has a certain logic function and comprises scan-in/scan-out type ECL latch circuits 77, 78 and 79, an AND gate 80, and an OR gate 81. The latch circuits 77 through 79 are basically the same as the second embodiment shown in FIG. 12. Scan addresses Adrs of the latch circuits 77, 78 and 79 respectively are "1", "2" and "3". When the latch circuit is selected by the scan address Adrs, the bits $\overline{AD1}$ and $\overline{AD2}$ of the corresponding latch selection signal are both "0". In FIG. 15, CLK and CLK' denote clock signals.

The LSI circuit is tested by a combination of basic operations (1) through (4) described hereunder.

(1) Set (or Reset) Operation:

All of the ECL latch circuits within the LSI circuit are set (or reset).

(2) Scan-In Operation:

With respect to the ECL latch circuits which are set (or reset) by the operation (1), a scan-in is made by selecting only the ECL latch circuit whose value is to be inverted by designating the address thereof.

(3) Clock Input Operation:

A clock signal is applied if necessary.

(4) Scan-Out Operation:

The value set (written) in the ECL latch circuit is read out by designating the address thereof.

Next, a description will be given of an example of the procedure when testing the AND gate 80 within the LSI circuit 76 shown in FIG. 15.

[1] Set operation (1).

[2] Clock input operation (3) (enter the value of C output from the AND gate 80 into the ECL latch circuit 79).

[3] Scan-out operation (4) from the address Adrs="3" (AND gate test for A=1, B=1 and C=1, where B and C are inputs to the AND gate 80).

[4] Set operation (1).

[5] Scan-in operation (2) to the address Adrs="1" (A=0).

[6] Scan-in operation (2) to the address Adrs="2" (B=0).

[7] Clock input operation (3).

[8] Scan-out operation (4) from the address Adrs="3" (AND gate test for A=0, B=0 and C=0).

Therefore, it is possible to test an arbitrary function within the LSI circuit.

Figure 16:
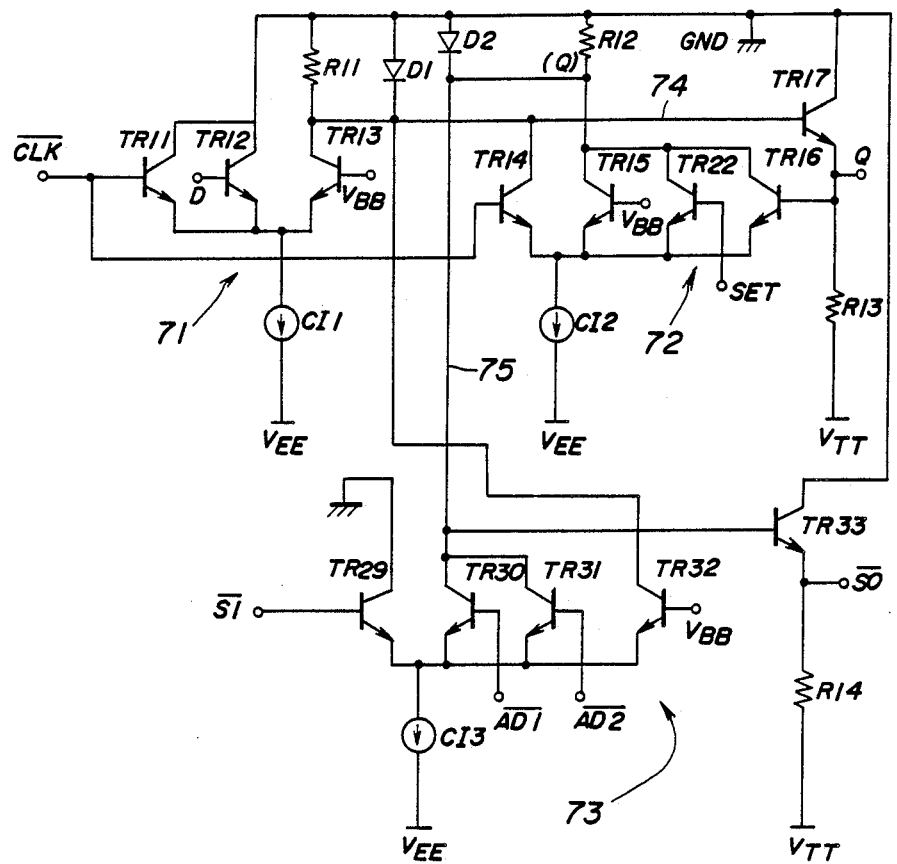
FIG. 16 is a circuit diagram showing a modification of the second embodiment.

FIG. 16 shows a modification of the second embodiment. In FIG. 16, those parts which are substantially the same as those corresponding parts in FIG. 12 are designated by the same reference numerals, and a description thereof will be omitted. According to this modification, the scan-in/scan-out circuit 73 operates in response to an inverted scan-in signal $\overline{SI}$ which is an inverted signal of the scan-in signal SI used in the second embodiment shown in FIG. 12. In this modification, the collector of the transistor TR29 is coupled to the ground GND instead of being coupled to the node 74, and the collector of the transistor TR32 is coupled to the node 74 instead of being coupled to the ground GND. The remaining parts of the ECL latch circuit shown in FIG. 16 are the same as the second embodiment.

Figure 17:
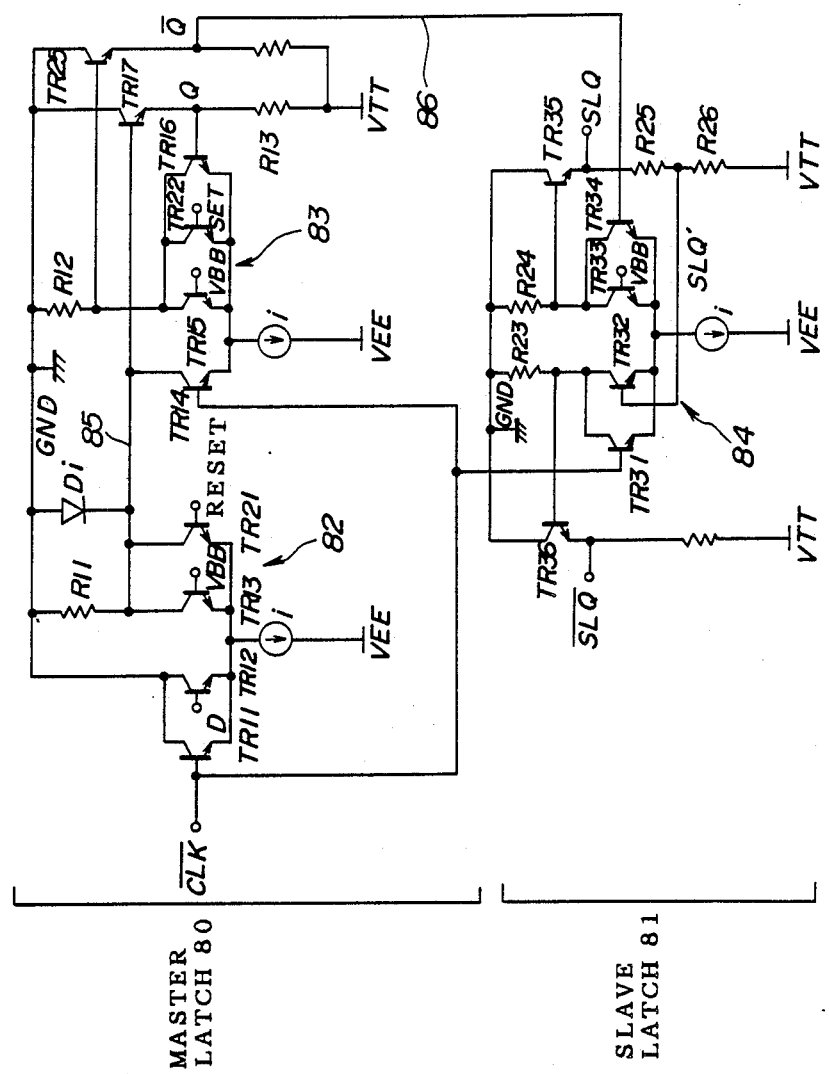
FIG. 17 is a circuit diagram showing a third embodiment of the ECL latch circuit according to the present invention.

Next, a description will be given of a third embodiment of the ECL latch circuit according to the present invention by referring to FIG. 17. In this embodiment, the ECL latch circuit is a master-slave latch circuit. In FIG. 17, those parts which are substantially the same as those corresponding parts in FIGS. 8 and 11 are designated by the same reference numerals.

In FIG. 17, the ECL latch circuit is made up of a master latch 80 and a slave latch 81. The master latch 80 comprises ECL gates 82 and 83, and the slave latch 81 comprises an ECL gate 84. A node 85 connects the ECL gates 82 and 83, and a node 86 connects the ECL gates 83 and 84. The ECL gate 82 constitutes a data input part for sampling the input data D, and the ECL gates 83 and 84 constitute a latch part for holding the input data. The slave latch 81 comprises transistors TR31 through TR35, resistors R23 through R26, and a constant current source i. SLQ and $\overline{SLQ}$ denote output signals of the slave latch 81, and SLQ' denotes a feedback signal.

The ECL gates 82, 83 and 84 respectively are level shift type ECL gates and output signals having a level which is shifted towards a higher level than a high level of the negative clock signal $\overline{CLK}$. This level shift is achieved by the collector load resistors R11, R12, R23 and R24 coupled to the output stage transistors of the respective ECL gates.

In the ECL gate 82, a current switching path is formed by the transistors TR11 and TR12 which are coupled in parallel and are respectively supplied with the signals $\overline{CLK}$ and D. Another current switching path is formed by the transistors TR13 and TR21 which are coupled in parallel and are respectively supplied with the signals $V_{BB}$ and RESET. The collectors of the transistors TR13 and TR21 become a signal output part to the node 85.

In the ECL gate 83, a current switching path is formed by the transistor TR14 which is supplied with the negative clock signal $\overline{CLK}$. The collector of the transistor TR14 is coupled to the collectors of the transistors TR13 and TR21 (collector dot) of the ECL gate 82 via the node 85. Another current switching path is formed by the transistors TR15, TR22 and TR16 which are coupled in parallel and are respectively supplied with the signals $V_{BB}$, SET and Q. The Q-output signal which is applied to the transistor TR16 is obtained from the transistor TR17 which is coupled to the node 85 and constitutes the emitter follower. In addition, the $\overline{Q}$-output signal is obtained from a transistor TR25 which is coupled to the collectors of the transistors TR15, TR22 and TR16 and constitutes an emitter follower. This $\overline{Q}$-output signal is supplied to the ECL gate 84.

In the ECL gate 84, a current switching path is formed by the transistors TR31 and TR32 which are coupled in parallel and are respectively supplied with the signals $\overline{CLK}$ and SLQ'. Another current switching path is formed by the transistors TR33 and TR34 which are coupled in parallel and are respectively supplied with the signals $V_{BB}$ and $\overline{Q}$. The output signals SLQ and $\overline{SLQ}$' are obtained from the collectors of the transistors TR33 and TR34 via the transistor TR35 which constitutes an emitter follower. The output signal SLQ' is obtained by shifting the level of the output signal SLQ to a lower level using the resistors R25 and R26.

Figure 18:
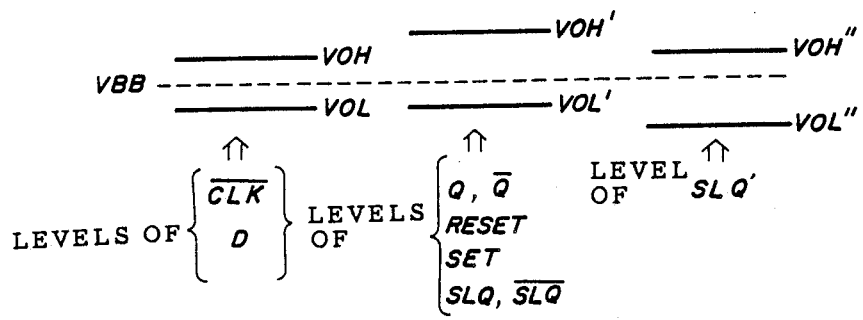
FIG. 18 is a diagram for explaining signal levels used in the third embodiment.

FIG. 18 is a diagram for explaining the signal levels used in this embodiment. High and low logic levels of the signals $\overline{CLK}$ and D are respectively denoted by VOH and VOL' and high and low logic levels of the signals Q, $\overline{Q}$, RESET, SET, SLQ and $\overline{SLQ}$ are respectively denoted by VOH' and VOL'. In addition, high and low logic levels of the signal SLQ' are respectively denoted by VOH" and VOL". In this case, the following relationships stand.

VOH'>VOH

VOL'=VOL

VOH"=VOH

VOL"<VOL

By maintaining the relationships of the logic levels of the signals as described above in conjunction with FIG. 18, the ECL latch circuit shown in FIG. 17 carries out a master-slave latch operation. In other words, the ECL gate 82 of the master latch 80 enters the value of the input data D when the negative clock signal $\overline{CLK}$ is "0", and the entered value is held in the ECL gate 83. In addition, the slave latch 81 enters and holds the $\overline{Q}$-output signal of the ECL gate 83 when the negative clock signal $\overline{CLK}$ is "1", and outputs the output signals SLQ and $\overline{SLQ}$.

Figure 19:
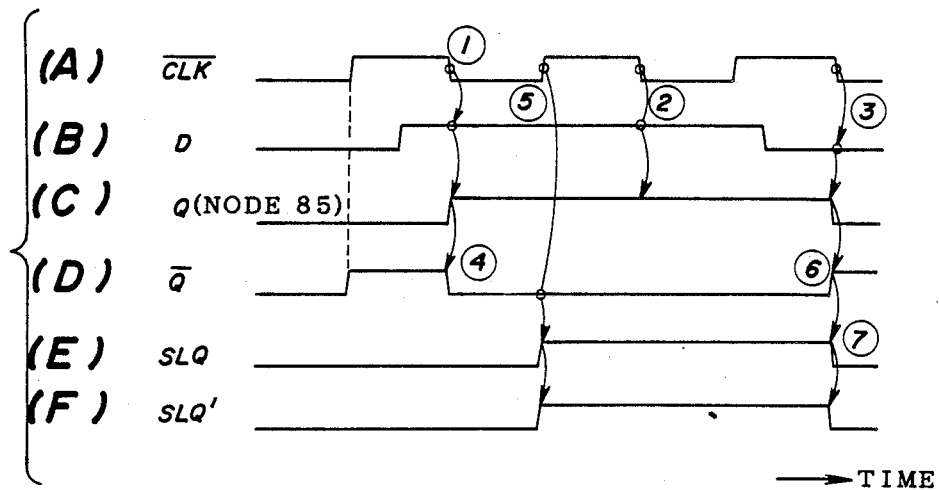
FIGS. 19(A) through 19(F) show signal waveforms for explaining an operation of the third embodiment.

Next, a more detailed description will be given of the operation of the ECL latch circuit shown in FIG. 17 by referring to FIGS. 19(A) through 19(F). FIGS. 19(A) and 19(B) respectively show the negative clock signal $\overline{CLK}$ and the input data D. FIGS. 19(C), 19(D), 19(E) and 19(F) respectively show the signals Q, $\overline{Q}$, SLQ and $\overline{SLQ}$. In the master latch 80, the transistors TR11 and TR12 are OFF if the negative clock signal $\overline{CLK}$ is "0" when the signals RESET and SET are "0". In this state, the transistor TR12 turns ON or OFF depending on the value "1" or "0" of the input data D. In other words, when the negative clock signal $\overline{CLK}$ is "0" and the input data D is "1" as indicated by 1 and ②in FIGS. 19(A) and 19(B), the transistors TR13 and TR21 turn OFF and the level at the node 85 becomes VOH'. In this state, the transistor TR14 is OFF. As a result, the Q-output signal having the level VOH' is applied to the transistor TR16 and the transistor TR16 turns ON. Thus, even when the negative clock signal $\overline{CLK}$ becomes "1", the OFF state of the transistor TR14 is maintained and the $\overline{Q}$-output signal has the level VOL'.

On the other hand, when the negative clock signal $\overline{CLK}$ is "0" and the input data D is "0" as indicated by ③ in FIGS. 19(A) and 19(B), the transistors T11 and TR12 turn OFF and the transistor TR13 turns ON. Hence, the level at the node 85 becomes VOL' and the transistor TR15 turns ON because the transistor TR16 is OFF. In this state, the transistor TR14 is OFF but the level at the node 85 is maintained to VOL'. When the negative clock signal $\overline{CLK}$ changes to "1", the transistor TR14 turns ON and the transistor TR15 turns OFF. These states of the transistors TR14 and TR15 are maintained and the $\overline{Q}$-output signal has the level VOH'.

A description will now be given of the operation of the slave latch 81. When the negative clock signal $\overline{CLK}$ is "0" and has the level VOL and the signal SLQ' has the level VOL", the transistor TR34 turns ON and the transistors TR31 and TR32 turn OFF if the $\overline{Q}$-output signal has the level VOH'. In this state, the signal SLQ has the level VOL'. Even when the $\overline{Q}$-output signal becomes "0" as indicated by ④ in FIG. 19(D), the transistor TR33 turns ON in place of the transistor TR34 while the negative clock signal $\overline{CLK}$ is "0" and the transistors TR31 and TR32 remain OFF. When the negative clock signal $\overline{CLK}$ changes to "1" as indicated by ⑤ in FIG. 19(A), the transistor TR31 turns ON and transistors TR33 and TR34 turn OFF. As a result, the levels of the signals SLQ and SLQ' respectively become VOH' and VOH" and the transistors TR31 and TR32 remain ON. When the negative clock signal $\overline{CLK}$ thereafter becomes "0", the transistor TR31 turns OFF but the ON state of the transistor TR32 is maintained and the level of the signal SLQ is VOH'. When the level of the $\overline{Q}$-output signal changes to VOH' as indicated by ⑥ in FIG. 19(D), the transistor TR34 turns ON and the TR31 and TR32 are held in the OFF state. The level of the signal SLQ is VOL' in this state.

The master-slave latch can be set by the set signal SET or reset by the reset signal RESET.

In the master latch 80, the transistor TR21 of the ECL gate 82 is unconditionally turned ON when the level of the reset signal RESET becomes VOH', and the Q-output signal and the $\overline{Q}$-output signal of the ECL gate 83 are respectively held at the levels VOL' and VOH'. This state is next transferred to the slave latch 81, and the output signals SLQ and $\overline{SLQ}$ of the slave latch 81 are output with the levels VOL' and VOH' respectively.

Similarly, when the level of the set signal SET applied to the transistor TR22 of the ECL gate 83 changes to VOH', the Q-output signal is held at the level VOH' and the $\overline{Q}$-output signal is held at the level VOL'. In addition, this state is transferred to the slave latch 81 and the slave latch 81 outputs the signals SLQ and $\overline{SLQ}$ respectively having the values "1" and "0".

Therefore, according to this embodiment, it is possible to constitute an ECL master-slave latch circuit by three ECL gates.

Figure 20:
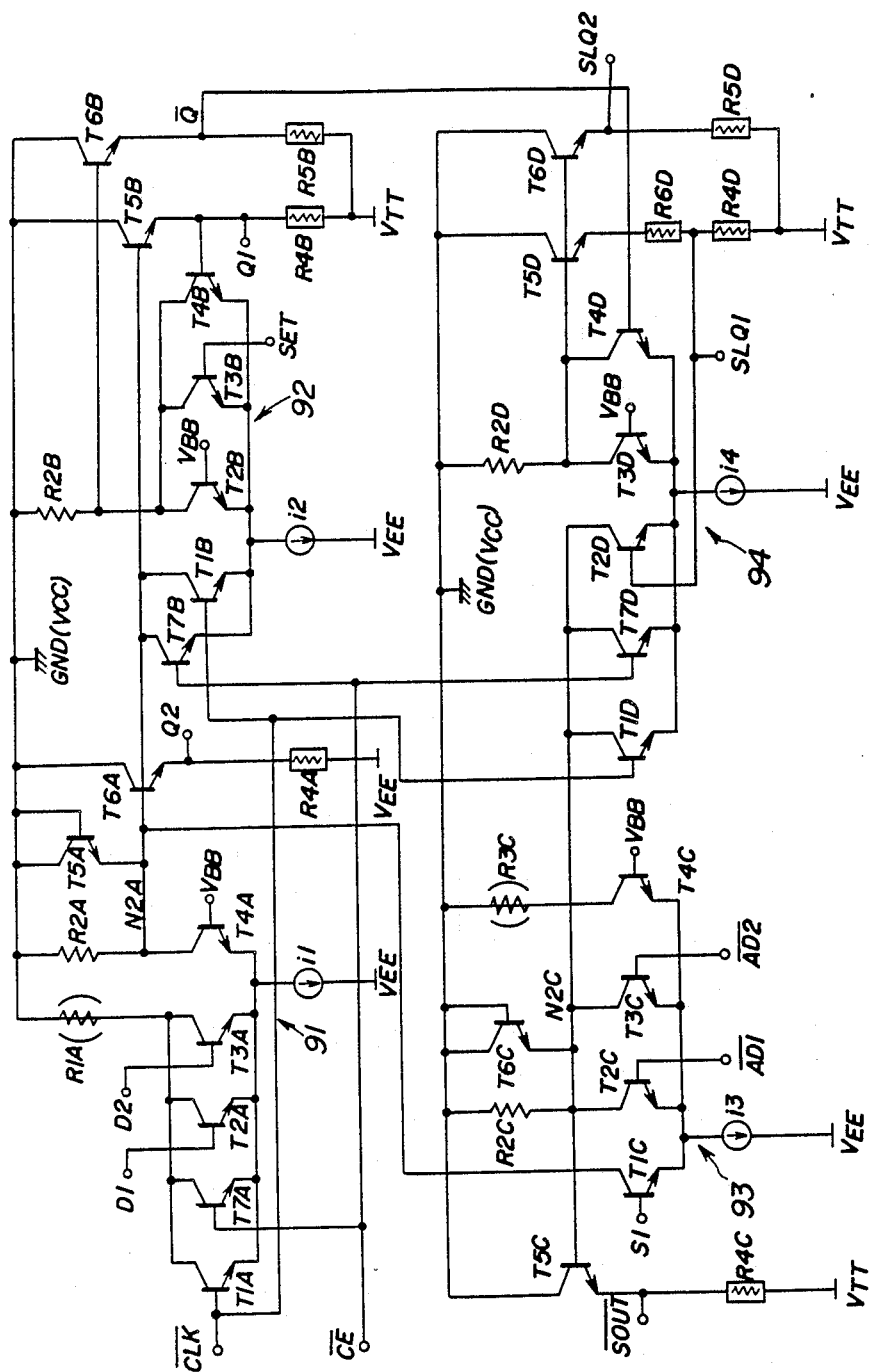
FIG. 20 is a circuit diagram showing a fourth embodiment of the ECL latch circuit according to the present invention.

FIG. 20 shows a fourth embodiment of the ECL latch circuit according to the present invention. In FIG. 20, the ECL latch circuit is made up of ECL gates 91 through 94 and functions as a scan-in/scan-out type ECL master-slave latch circuit. The ECL gates 91 and 92 respectively constitute a data input part and a master latch part of the ECL master-slave latch circuit. The ECL gate 93 constitutes a scan-in/scan-out circuit, and the ECL gate 94 constitutes a slave latch of the ECL master-slave latch circuit. The ECL master-slave latch constituted by the ECL gates 91, 92 and 94 is basically the same as the third embodiment shown in FIG. 17.

The ECL gate 91 comprises transistors T1A through T7A, resistors R1A, R2A and R4A, and a constant current source i1. The ECL gate 92 comprises transistors T1B through T6B, resistors R2B, R4B and R5B, and a constant current source i2. The ECL gate 93 comprises transistors T1C through T6C, resistors R2C, R3C and R4C, and a constant current source i3. The ECL gate 94 comprises transistors T1D through T7D, resistors R2D, R4D, R5D and R6D, and a constant current source i4. A node N2A couples the ECL gates 91, 92 and 93. A node N2C couples the ECL gates 93 and 94.

The signal designations used in FIG. 20 are basically the same as those used heretofore. CLK denotes the negative clock signal, D1 and D2 denote input data, $\overline{CE}$ denotes a clock enable signal, SET denotes a set signal, Q1, Q2, Q, $\overline{Q}$, SLQ1 and SLQ2 denote output signals, $\overline{AD1}$ and $\overline{AD2}$ denote bits of a latch selection signal, SI denotes a scan-in signal, and $\overline{SOUT}$ denotes a scan-out signal. $V_{BB}$ denotes a reference voltage, GND ($V_{CC}$) denotes a ground voltage, and $V_{EE}$ and $V_{TT}$ denote power source voltages.

Figure 21:
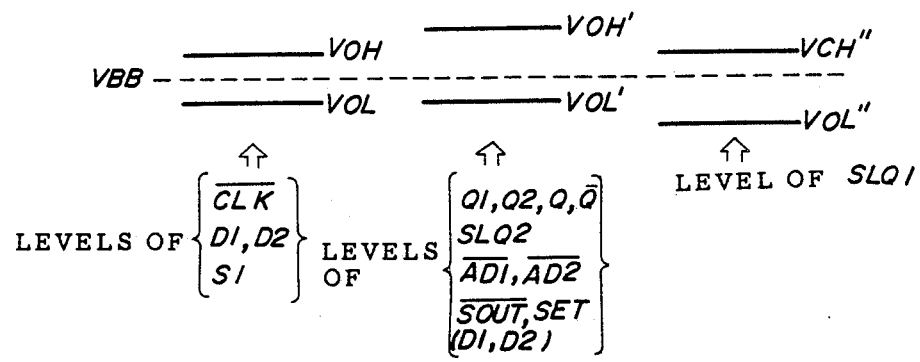
FIG. 21 is a diagram for explaining signal levels used in the fourth embodiment.
Figure 22:
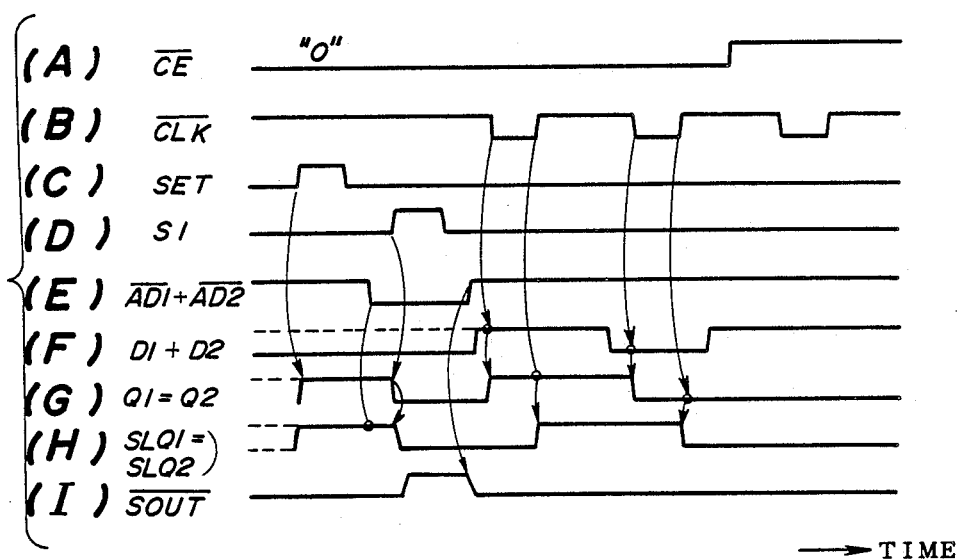
FIGS. 22(A) through 22(I) show signal waveforms for explaining an operation of the fourth embodiment.

FIG. 21 is a diagram for explaining signal levels used in the fourth embodiment. High and low logic levels of the signals $\overline{CLK}$, D1, D2 and SI are respectively denoted by VOH and VOL. High and low logic levels of the signals Q1, Q2, Q, $\overline{Q}$, SLQ2, AD1, AD2, $\overline{SOUT}$ and SET are respectively denoted by VOH' and VOL'. In addition, high and low logic levels of the signal SLQ1 are respectively denoted by VOH" and VOL". The signal levels are set so as to satisfy the following relationships.

VOH' > VOH

VOL' = VOL

VOH" = VOH

VOL" < VOL

As a modification of the setting the signal levels, the high and low levels of the signals D1 and D2 may respectively be set to VOH' and VOL'.

The ECL gates 91, 92 and 94 respectively correspond to the ECL gates 82, 83 and 84 shown in FIG. 17 and constitute the ECL master-slave latch. But in this embodiment, the ECL gates 91, 92 and 94 respectively have the transistors T7A, T7B and T7D for inputting the clock enable signal $\overline{CE}$. In addition, the input data D1 and D2 are respectively applied to the transistors T2A and T3A which are coupled in parallel. In FIG. 20, a terminal for receiving the reset signal RESET is omitted.

When the clock enable signal $\overline{CE}$ is "0", the transistors T7A, T7B and T7C turn OFF and the ECL master-slave latch is enabled. The operation of the ECL master-slave latch when the input data D1 and D2 are input is basically the same as the operation when the input data D is input in FIG. 17.

Next, a description will be given of the ECL gate 93 of the scan-in/scan-out circuit. In the ECL gate 93, a first current switching path is formed by the transistor T1C which is supplied with the scan-in signal SI. A collector of the transistor T1C is coupled to a collector of the output stage transistor T4A (collector dot) of the ECL gate 91 via the node N2A. A second current switching path is formed by the transistors T2C and T3C which are coupled in parallel and are respectively supplied with the signals AD1 and AD2. A third current switching path is formed by the transistor T4C which is supplied with the reference voltage $V_{BB}$. A collector of the transistor T4C is coupled to the ground GND via the resistor R3C, but collectors of the transistors T2C and T3C are coupled in common to the node N2C. This node N2C is coupled to the ground GND via the resistor R2C. This node N2C is also coupled to collectors of the transistors T1D, T2D and T7D (collector dot) of the current switching path within the ECL gate 94.

The scan-out signal $\overline{SOUT}$ is obtained from the node N2C via the transistor T5C which constitutes an emitter follower. The ECL gate 93 is selected when the bits $\overline{AD1}$ and $\overline{AD2}$ of the latch selection signal are both "0" and functions as the scan-in/scan-out circuit of the ECL master-slave latch.

Next, a description will be given of a scan-in/scan-out operation of the fourth embodiment shown in FIG. 20 by referring to FIGS. 22(A) through 22(I). When making a scan-in operation, the set signal SET having the value "1" is applied to all of the ECL master-slave latches within the LSI circuit to set the value "1" in each of the ECL master-slave latches. Hence, the output signals Q1, Q2, SLQ1 and SLQ2 are set to "1" in each of the ECL master-slave latches. Then, the address of the ECL master-slave latch to be selected is designated by setting the bits $\overline{AD1}$ and $\overline{AD2}$ of the latch selection signal to "0". address selection state can be described as $\overline{AD1} + \overline{AD2}$ = "0".

When becomes $\overline{AD1} + \overline{AD2}$ becomes "0", the transistors T2C and T3C turn OFF. Hence, the node N2C transfers the collector potential of the transistors T1D, T2D and T7D within the ECL gate 93 (slave latch) to the base of the transistor T5C which outputs the signal as the scan-out signal $\overline{SOUT}$.

Next, when the scan-in signal SI having the value "1" is applied to the transistor T1C in a state where $\overline{AD1} + \overline{AD2}$ = "0", the transistor T1C turns ON and the level at the node N2A in the ECL gate 91 becomes VOL'. As a result, the value in the ECL master-slave latch is switched from "1" to "0", and the output signals Q1, Q2, SLQ1 and SLQ2 become "0".

When $\overline{AD1} + \overline{AD2}$ is thereafter returned to "1" from "0" and the selection of this ECL master-slave latch is cancelled, the scan-in/scan-out operation ends.

Then, when one or both of the input data D1 and D2 is set to "1", D1+D2 becomes "1" and the output signals Q1 and Q2 become "1" in the master latch at a falling edge of the negative clock signal $\overline{CLK}$. The output signals Q1 and Q2 are transferred to the slave latch at a rising edge of the negative clock signal $\overline{CLK}$ and the output signals SLQ1 and SLQ2 become "1".

When D1+D2 changes from "1" to "0", the output signals Q1 and Q2 become "0" at the next falling edge of the negative clock signal $\overline{CLK}$ and the output signals SLQ1 and SLQ2 become "0" at the next rising edge of the negative clock signal $\overline{CLK}$.

The operation described above is carried out while the clock enable signal $\overline{CE}$ is "0".

According to this embodiment, the scan-in/scan-out type ECL master-slave latch circuit can be constituted by four ECL gates.

Figure 23:
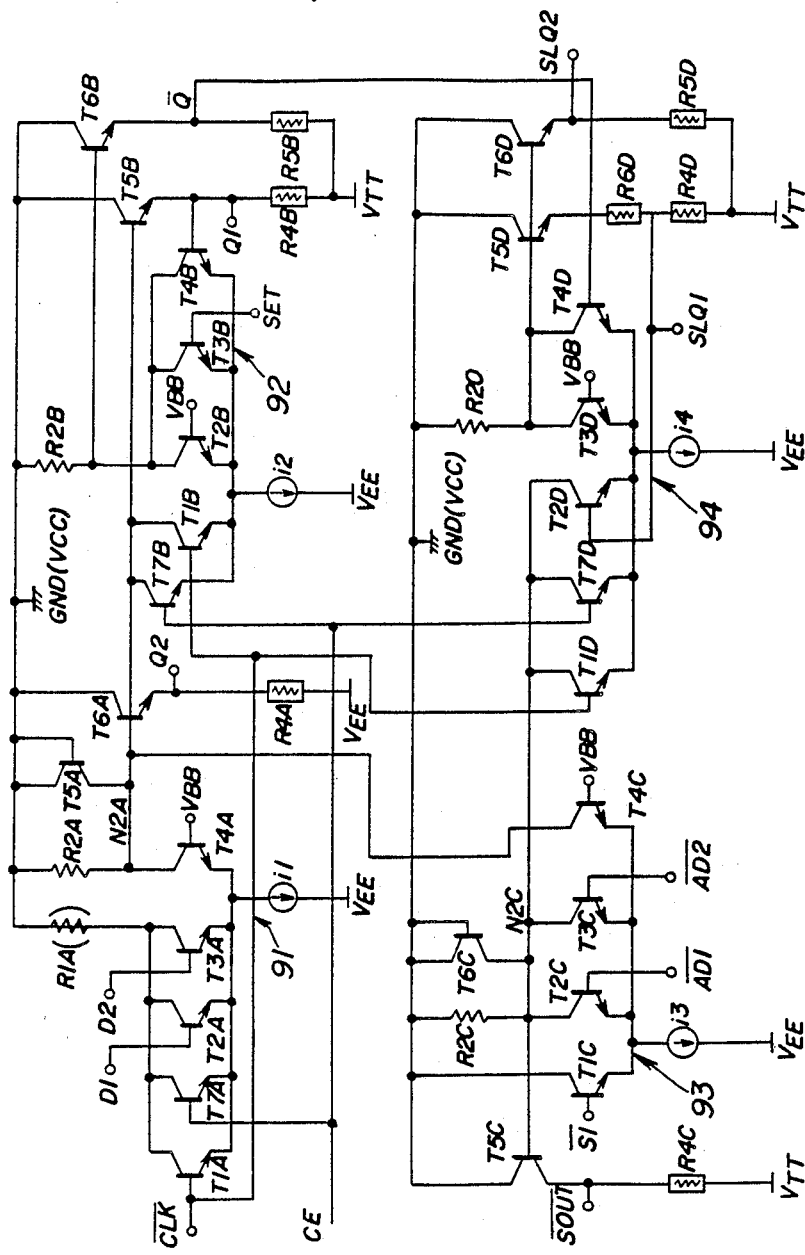
FIG. 23 is a circuit diagram showing a modification of the fourth embodiment.

FIG. 23 shows a modification of the fourth embodiment. In FIG. 23, those parts which are substantially the same as those corresponding parts in FIG. 20 are designated by the same reference numerals, and a description thereof will be omitted. According to this modification, the ECL gate 93 operates in response to an inverted scan-in signal $\overline{SI}$ which is an inverted signal of the scan-in signal SI used in the fourth embodiment shown in FIG. 20. In this modification, the resistor R3C of the ECL gate 93 is omitted. In addition, the collector of the transistor T1C is coupled to the ground GND instead of being coupled to the node N2A, and the collector of the transistor T4C is coupled to the node N2A instead of being coupled to the ground GND. The remaining parts of the scan-in/scan-out type ECL master-slave latch circuit shown in FIG. 23 are the same as the fourth embodiment.

In the fourth embodiment and the modification thereof, the resistors R1A and R3C may be omitted, and for this reason, these resistors R1A and R3C are shown in brackets in FIGS. 20 and 23.

Further, the present invention is not limited to these embodiments, but various variations and modifications may be made without departing from the scope of the present invention.

What is claimed is:

1. An emitter coupled logic latch circuit, comprising:
  a first power source for supplying a first power source voltage;
  a second power source for supplying a second power source voltage;
  a third power source for supplying a third power source voltage;
  a data input part comprising:
    first, second and third transistors having collectors coupled to said first power source and emitters coupled in common at a first node and having bases respectively supplied with a clock signal, input data and a reference voltage; and
    a first constant current source coupled between the first node and said second power source; and
  a latch part comprising:
    a fourth transistor having a collector coupled to the collector of said third transistor at a second node and a base supplied with said clock signal;

fifth and sixth transistors having collectors coupled in common to said first power source and emitters coupled in common to an emitter of said fourth transistor at a third node, said fifth transistor having a base supplied with the reference voltage, and said sixth transistor having a base;

a second constant current source coupled between the third node and said second power source; and a seventh transistor having a base coupled to the second node and a collector and an emitter respectively coupled to said first and third power sources, the base of said sixth transistor connected to the emitter of said seventh transistor at a fourth node from which an output signal of said emitter coupled logic latch circuit is obtained.

2. An emitter coupled logic latch circuit as claimed in claim 1, further comprising a diode coupled between said first power source and said second node.

3. An emitter coupled logic latch circuit as claimed in claim 1, wherein said clock signal and said input data have first and second levels for respectively indicating high and low logic values, and said output signal of said emitter coupled logic latch circuit has third and fourth levels for respectively indicating the high and low logic values, said third level being higher than said first level, said second and fourth levels being lower than the reference voltage, and said reference voltage having an intermediate level between said first and second levels.

4. An emitter coupled logic latch circuit as claimed in claim 1, wherein said data input part further comprises an eighth transistor having a collector coupled to said second node, an emitter coupled to said first node and a base for receiving a reset signal, and said latch part further comprises a ninth transistor having a collector coupled to the collectors of said fifth and sixth transistors, an emitter coupled to said third node and a base for receiving a set signal.

5. An emitter coupled logic latch circuit as claimed in claim 4, wherein said data input part further comprises a capacitor coupled between said first node and said first power source.

6. An emitter coupled logic latch circuit as claimed in claim 4, wherein said latch part further comprises a tenth transistor having a collector and an emitter respectively coupled to said first and third power sources and a base coupled to the collectors of said fifth and sixth transistors, and an inverted signal of said output signal of said emitter coupled logic latch circuit being obtained from the emitter of said tenth transistor.

7. An emitter coupled logic latch circuit as claimed in claim 1, wherein said first, second and third power source voltages and said reference voltage respectively are approximately 0 V, −3.6 V, −2.0 V and −1.3 V.

8. An emitter coupled logic latch circuit as claimed in claim 1, wherein said latch part further comprises an eighth transistor having a collector coupled to the collectors of said fifth and sixth transistors at a fifth node, an emitter coupled to said third node and a base for receiving a set signal, and said emitter coupled logic latch circuit further comprises a scan-in/scan out circuit comprising:

ninth and tenth transistors having collectors coupled to said first power source, bases respectively supplied with a scan-in signal and said reference voltage, and emitters coupled in common to a sixth node;

eleventh transistors having collectors coupled in common to said first power source via the fifth node, bases each respectively supplied with a bit of a latch selection signal, and emitters coupled in common to said sixth node;

a third constant current source coupled between said sixth node and said second power source; and a twelfth transistor having a collector coupled to said first power source, a base coupled to said fifth node, and an emitter coupled to said third power source, and an output scan-out signal of said scan-in/scan-out circuit being obtained from the emitter of said twelfth transistor.

9. An emitter coupled logic latch circuit as claimed in claim 8, further comprising:

a first diode coupled between said first power source and said second node; and a second diode coupled between said first power source and the collectors of said fifth, sixth, eighth and eleventh transistors.

10. An emitter coupled logic latch circuit as claimed in claim 8, wherein said clock signal, said input data and said scan-in signal have first and second levels for respectively indicating high and low logic values, and said output signal of said emitter coupled logic latch circuit, said set signal, said scan-out signal and each bit of said latch selection signal have third and fourth levels for respectively indicating the high and low logic values, said third level being higher than said first level, said second and fourth levels being lower than the reference voltage, and said reference voltage having an intermediate level between said first and second levels.

11. An emitter coupled logic latch circuit as claimed in claim 8, wherein said clock signal and said scan-in signal have first and second levels for respectively indicating high and low logic values, and said input data, said output signal of said emitter coupled logic latch circuit, said set signal, said scan-out signal and each bit of said latch selection signal have third and fourth levels for respectively indicating the high and low logic values, said third level being higher than said first level, said second and fourth levels being lower than the reference voltage, and said reference voltage having an intermediate level between said first and second levels.

12. An emitter coupled logic latch circuit as claimed in claim 1, wherein said data input part further comprises an eighth transistor having a collector coupled to said second node, an emitter coupled to said first node and a base for receiving a reset signal, said latch part further comprises:

a ninth transistor having a collector coupled to the collectors of said fifth and sixth transistors, an emitter coupled to said third node and a base for receiving a set signal; and a tenth transistor having a collector and an emitter respectively coupled to said first and third power sources and a base coupled to the collectors of said fifth and sixth transistors, and an output signal of said emitter coupled logic latch circuit being obtained from the emitter of said tenth transistor, said data input part and said latch part comprising a master latch, and said emitter coupled logic circuit further comprises a slave latch comprising:

eleventh and twelfth transistors having collectors coupled in common to said first power source, emitters coupled in common to a fifth node, and bases respectively supplied with said clock signal and a predetermined signal;

thirteenth and fourteenth transistors having collectors coupled in common to said first power source, emitter coupled in common to said fifth node, and bases respectively supplied with said reference voltage and said inverted signal;

a third constant current source coupled between said fifth node and said second power source;

fifteenth and sixteenth transistors having collectors coupled to said first power source, emitters coupled to said third power source, and bases respectively coupled to the collectors of said eleventh and twelfth transistors and the collectors of said thirteenth and fourteenth transistors; and a voltage divider coupled between the emitter of said sixteenth transistor and said third power source, complementary output signals of said slave latch being obtained from the emitters of said fifteenth and sixteenth transistors, and said predetermined signal being obtained from said voltage divider.

13. An emitter coupled logic latch circuit as claimed in claim 12, further comprising a diode coupled between said first power source and said second node.

14. An emitter coupled logic latch circuit as claimed in claim 12, wherein said clock signal and said input data have first and second levels for respectively indicating high and lower logic values, said output signals of said emitter coupled logic latch circuit, said set signal, said reset signal and said complementary output signals of said slave latch have third and fourth levels for respectively indicating the high and low logic levels, and said predetermined signal has fifth and sixth levels for respectively indicating the high and low logic values, said third level being higher than said first level, said second and fourth levels being lower than the reference voltage, said fifth level being the same as said first level, said sixth level being lower than said second and fourth levels, and said reference voltage having an intermediate level between said first and second levels.

15. An emitter coupled logic latch circuit as claimed in claim 12, further comprising a scan-in/scan-out circuit comprising:

seventeenth and eighteenth transistors having collectors coupled to said first power source, bases respectively supplied with a scan-in signal and said reference voltage, and emitters coupled in common to a sixth node;

nineteenth transistors having collectors coupled in common to said first power source via a seventh node, bases each respectively supplied with a bit of a latch selection signal, and emitters coupled in common to said sixth node;

a fourth constant current source coupled between said sixth node and said second power source; and a twentieth transistor having a collector coupled to said first power source, a base coupled to said seventh node, and an emitter coupled to said third power source, and an output scan-out signal of said scan-in/scan-out circuit being obtained from the emitter of said twentieth transistor.

16. An emitter coupled logic latch circuit as claimed in claim 15, wherein said clock signal, said input data and said scan-in signal have first and second levels for respectively indicating high and low logic values, and said output signals of said emitter coupled logic latch circuit, said set signal, said scan-out signal, each bit of said latch selection signal and said complementary output signals of said slave latch have third and fourth levels for respectively indicating the high and low logic values, and said predetermined signal has fifth and sixth levels for respectively indicating the high and low logic values, said third level being higher than said first level, said second and fourth levels being lower than the reference voltage, said fifth level being the same as said first level, said sixth level being lower than said second and fourth levels, and said reference voltage having an intermediate level between said first and second levels.

17. An emitter coupled logic latch circuit as claimed in claim 15, wherein said clock signal and said scan-in signal have first and second levels for respectively indicating high and low logic values, and said input data, said output signals of said emitter coupled logic latch circuit, said set signal, said scan-out signal, each bit of said latch selection signal and said complementary output signals of said slave latch have third and fourth levels for respectively indicating the high and low logic values, and said predetermined signal has fifth and sixth levels for respectively indicating the high and low logic values, said third level being higher than said first level, said second and fourth levels being lower than the reference voltage, said fifth level being the same as said first level, said sixth level being lower than said second and fourth levels, and said reference voltage having an intermediate level between said first and second levels.

18. An emitter coupled logic latch circuit as claimed in claim 15, wherein the base of said twentieth transistor is coupled to the collectors of said eleventh and twelfth transistors.

19. An emitter coupled logic latch circuit as claimed in claim 15, further comprising a diode coupled between said first power source and said seventh node.

20. An emitter coupled latch circuit, comprising:

a pair of input transistors coupled in parallel receiving a single clock signal and a data signal;

an output transistor coupled to said pair of input transistors, receiving a reference voltage and producing a level shifted data signal;

a latch transistor coupled to the output transistor and receiving the single clock signal;

a pair of emitter coupled transistors coupled to the latch transistor, receiving an output signal and the reference voltage; and an emitter follower transistor coupled to the output transistor and producing the output signal.

* * * * *

UNITED STATES PATENT AND TRADEMARK OFFICE
CERTIFICATE OF CORRECTION

PATENT NO. : 4,970,417
DATED : NOVEMBER 13, 1990
INVENTOR(S) : KATSUHISA KUBOTO

It is certified that error appears in the above-identified patent and that said Letters Patent is hereby corrected as shown below:

Col. 15, line 62, "TR31" should be --transistors TR31--.

Col. 17, line 29, "AD1 and AD2" should be --$\overline{AD1}$ and $\overline{AD2}$--;
line 57, ""0". address" should be --"0". This address--;
line 59, "When becomes" should be --When--.

Col. 21, line 8, "emitter" should be --emitters--;
line 33, "lower" should be --low--.

Signed and Sealed this

Twenty-sixth Day of May, 1992

*Attest:*

DOUGLAS B. COMER

*Attesting Officer*    Acting Commissioner of Patents and Trademarks